United States Patent [19]
Johnsgard et al.

[11] Patent Number: 5,830,277
[45] Date of Patent: Nov. 3, 1998

[54] THERMAL PROCESSING SYSTEM WITH SUPPLEMENTAL RESISTIVE HEATER AND SHIELDED OPTICAL PYROMETRY

[75] Inventors: Kristian E. Johnsgard, Los Gatos; James McDiarmid, Pleasanton, both of Calif.

[73] Assignee: Mattson Technology, Inc., Fremont, Calif.

[21] Appl. No.: 451,789

[22] Filed: May 26, 1995

[51] Int. Cl.$^6$ ............... C23C 16/00; G01J 5/00; F27B 5/14; F27D 11/00

[52] U.S. Cl. .......... 118/725; 118/728; 118/729; 118/730; 118/666; 118/712; 118/713; 118/724; 432/253; 219/390; 219/405; 219/411; 392/416; 392/418; 374/126; 374/130; 374/131; 374/141

[58] Field of Search ................. 118/725, 724, 118/712, 713, 666, 728, 729, 730; 432/241, 253; 219/390, 405, 411; 392/416, 418; 374/126, 128, 130, 131, 141

[56] References Cited

U.S. PATENT DOCUMENTS

| | | | |
|---|---|---|---|
| 4,350,537 | 9/1982 | Young et al. | 148/1.5 |
| 4,469,529 | 9/1984 | Mimura | 148/1.5 |
| 4,493,977 | 1/1985 | Arai et al. | 219/411 |
| 4,504,730 | 3/1985 | Shimizu | 219/411 |
| 4,533,820 | 8/1985 | Shimizu | 219/411 |
| 4,535,227 | 8/1985 | Shimizu | 219/411 |
| 4,535,228 | 8/1985 | Mimura et al. | 219/411 |
| 4,560,286 | 12/1985 | Wickersheim | 374/131 |
| 4,649,261 | 3/1987 | Sheets | 219/390 |
| 4,680,451 | 7/1987 | Gat et al. | 219/411 |
| 4,698,486 | 10/1987 | Sheets | 250/492.2 |
| 4,750,139 | 6/1988 | Dils | 364/557 |
| 4,755,654 | 7/1988 | Crowley et al. | 219/390 |
| 4,818,327 | 4/1989 | Davis et al. | 156/345 |
| 4,821,674 | 4/1989 | deBoer et al. | 118/666 |

(List continued on next page.)

FOREIGN PATENT DOCUMENTS

| | | | |
|---|---|---|---|
| 0 612 862 A1 | 8/1994 | European Pat. Off. | C23C 16/52 |
| 0 718 610 A1 | 6/1996 | European Pat. Off. | G10J 5/00 |
| 1-24726 | 5/1989 | Japan | 392/418 |
| 5-335253 | 12/1993 | Japan | 118/725 |

OTHER PUBLICATIONS

PCT International Search Report in PCT/US96/06627.
Patent Abstracts of Japan, vol. 15, No. 460 (P–1278), 21 Nov. 1991 & JP, A,03 195928 (NEC), 27 Aug. 1991, see attract.
AG Associates, "Heatpulse™ 8108 RTP System," data sheet, 4106, Sep. 1992.
AG Associates, "Heatpulse® 8108 Technical Specifications", Nucl. Instrum. Meth. Phys. Res. B21, at 622–626 (1987).
L. Peters, "The Hottest Topic in RTP," Semiconductor International, at 56–62, Aug. 1991.
L. Peters, "Why You Need RTP," Semiconductor Intenational, at 72–74, Sep., 1991.

(List continued on next page.)

*Primary Examiner*—R. Bruce Breneman
*Assistant Examiner*—Jeffrie R. Lund
*Attorney, Agent, or Firm*—Wilson Sonsini Goodrich & Rosati

[57] ABSTRACT

System and method for determining thermal characteristics, such as temperature, temperature uniformity and emissivity, during thermal processing using shielded pyrometry. The surface of a semiconductor substrate is shielded to prevent interference from extrinsic light from radiant heating sources and to form an effective black-body cavity. An optical sensor is positioned to sense emitted light in the cavity for pyrometry. The effective emissivity of the cavity approaches unity independent of the semiconductor substrate material which simplifies temperature calculation. The shield may be used to prevent undesired backside deposition. Multiple sensors may be used to detect temperature differences across the substrate and in response heaters may be adjusted to enhance temperature uniformity.

80 Claims, 13 Drawing Sheets

U.S. PATENT DOCUMENTS

| | | | |
|---|---|---|---|
| 4,836,138 | 6/1989 | Robinson et al. | 118/666 |
| 4,845,647 | 7/1989 | Dils et al. | 364/557 |
| 4,857,689 | 8/1989 | Lee | 219/10.71 |
| 4,859,079 | 8/1989 | Wickersheim et al. | 374/131 |
| 4,891,499 | 1/1990 | Moslehi | 219/502 |
| 4,913,929 | 4/1990 | Moslehi et al. | 427/39 |
| 4,956,538 | 9/1990 | Moslehi | 219/121.6 |
| 4,975,561 | 12/1990 | Robinson et al. | 219/390 |
| 4,993,355 | 2/1991 | deBoer et al. | 118/641 |
| 4,996,942 | 3/1991 | deBoer et al. | 118/666 |
| 5,002,630 | 3/1991 | Kermani et al. | 156/610 |
| 5,011,794 | 4/1991 | Grim et al. | 437/247 |
| 5,034,199 | 7/1991 | Zavracky et al. | 422/245 |
| 5,063,031 | 11/1991 | Sato | 422/245 |
| 5,101,764 | 4/1992 | Loewenstein et al. | 118/712 |
| 5,102,231 | 4/1992 | Loewenstein et al. | 374/129 |
| 5,114,242 | 5/1992 | Gat et al. | 374/128 |
| 5,117,769 | 6/1992 | deBoer et al. | 118/666 |
| 5,148,714 | 9/1992 | McDiarmid | 74/89.15 |
| 5,154,512 | 10/1992 | Schietinger et al. | 374/9 |
| 5,155,336 | 10/1992 | Gronet et al. | 219/411 |
| 5,156,461 | 10/1992 | Moslehi et al. | 374/121 |
| 5,156,820 | 10/1992 | Wong et al. | 422/186.05 |
| 5,165,796 | 11/1992 | Gat et al. | 374/128 |
| 5,166,080 | 11/1992 | Schietinger et al. | 437/7 |
| 5,180,226 | 1/1993 | Moslehi | 374/127 |
| 5,198,034 | 3/1993 | deBoer et al. | 118/725 |
| 5,208,643 | 5/1993 | Fair | 356/43 |
| 5,268,989 | 12/1993 | Moslehi et al. | 392/418 |
| 5,275,976 | 1/1994 | Moslehi | 437/225 |
| 5,293,216 | 3/1994 | Moslehi | 356/371 |
| 5,296,385 | 3/1994 | Moslehi et al. | 437/20 |
| 5,305,417 | 4/1994 | Najm et al. | 392/418 |
| 5,310,260 | 5/1994 | Schietinger et al. | 374/142 |
| 5,317,492 | 5/1994 | Gronet et al. | 362/294 |
| 5,318,634 | 6/1994 | deBoer et al. | 118/730 |
| 5,326,170 | 7/1994 | Moslehi et al. | 374/2 |
| 5,350,899 | 9/1994 | Ishikawa et al. | 219/494 |
| 5,367,606 | 11/1994 | Moslehi et al. | 392/418 |
| 5,427,620 | 6/1995 | deBoer et al. | 118/725 |
| 5,444,217 | 8/1995 | Moore et al. | 219/405 |
| 5,549,756 | 8/1996 | Soresen et al. | 118/715 |
| 5,660,472 | 8/1997 | Peuse e t al. | 374/128 |
| 5,683,518 | 11/1997 | Moore et al. | 118/730 |

OTHER PUBLICATIONS

D. Aitken et al., "A New VLSI Compatible Rapid Thermal Processing System," Nucl. Instrum. Meth. Phys. Res. B21, at 622–626 (1987).

J. Gelpey et al., "Rapid Annealing Using the Water–Wall Arc Lamp," Nucl. Instrum. Meth. Phys. Res. B6, at 316–320 (1985).

M. Moslehi et al., "Advanced Equipment and Sensor Technologies for Rapid Thermal Processing," ULSI Science and Technology (J.M. Andrews and G.K. Celler, eds.), at 503–527. The Electrochemical Society, Pennington, N.J. (1991).

F. Roozeboom, "Manufacturing Equipment Issues in Rapid Thermal Processing," Rapid Thermal Processing Science and Technology (R. Fair ed.) at 349–423 (1993).

C. Schietinger et al., "Ripple Technique; a novel non–contact wafer emissivity and temperature method for RTP," Accufiber Technical Note, Apr. 1991, No. 22; Presented at MRS, Material Research Society Spring, 1991 Meeting.

R. Sheets, "Automatic Cassette to Cassette Radiant Impulse Processor," Nucl. Instrum. Meth. Phys. Res. B6, at 219–223 (1985).

R. Sheets, "Temperature Measurement and Control in a Rapid Thermal Processor," Mat. Res. Soc. Symp. Proc. vol. 52, at 191–197 (1986).

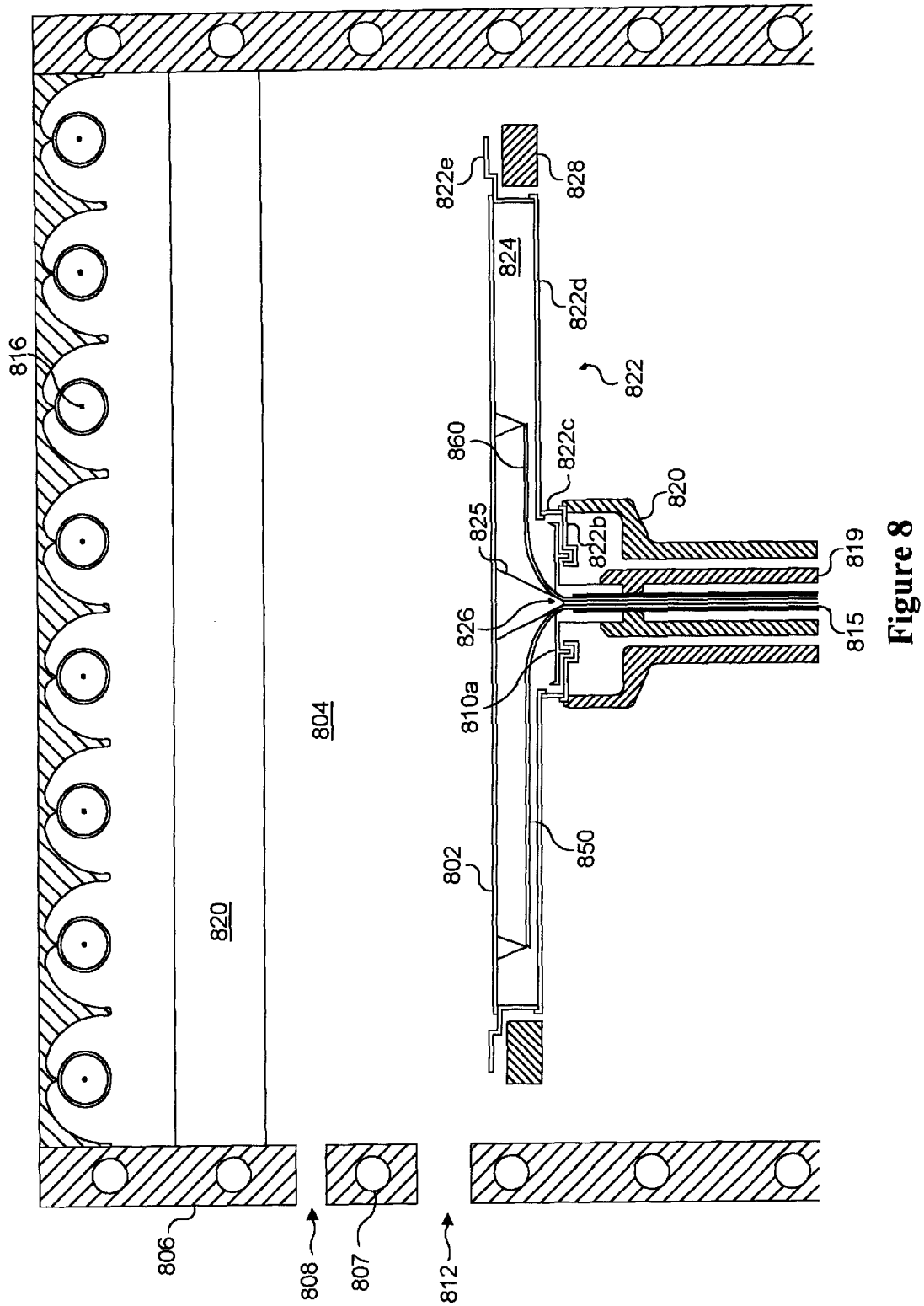

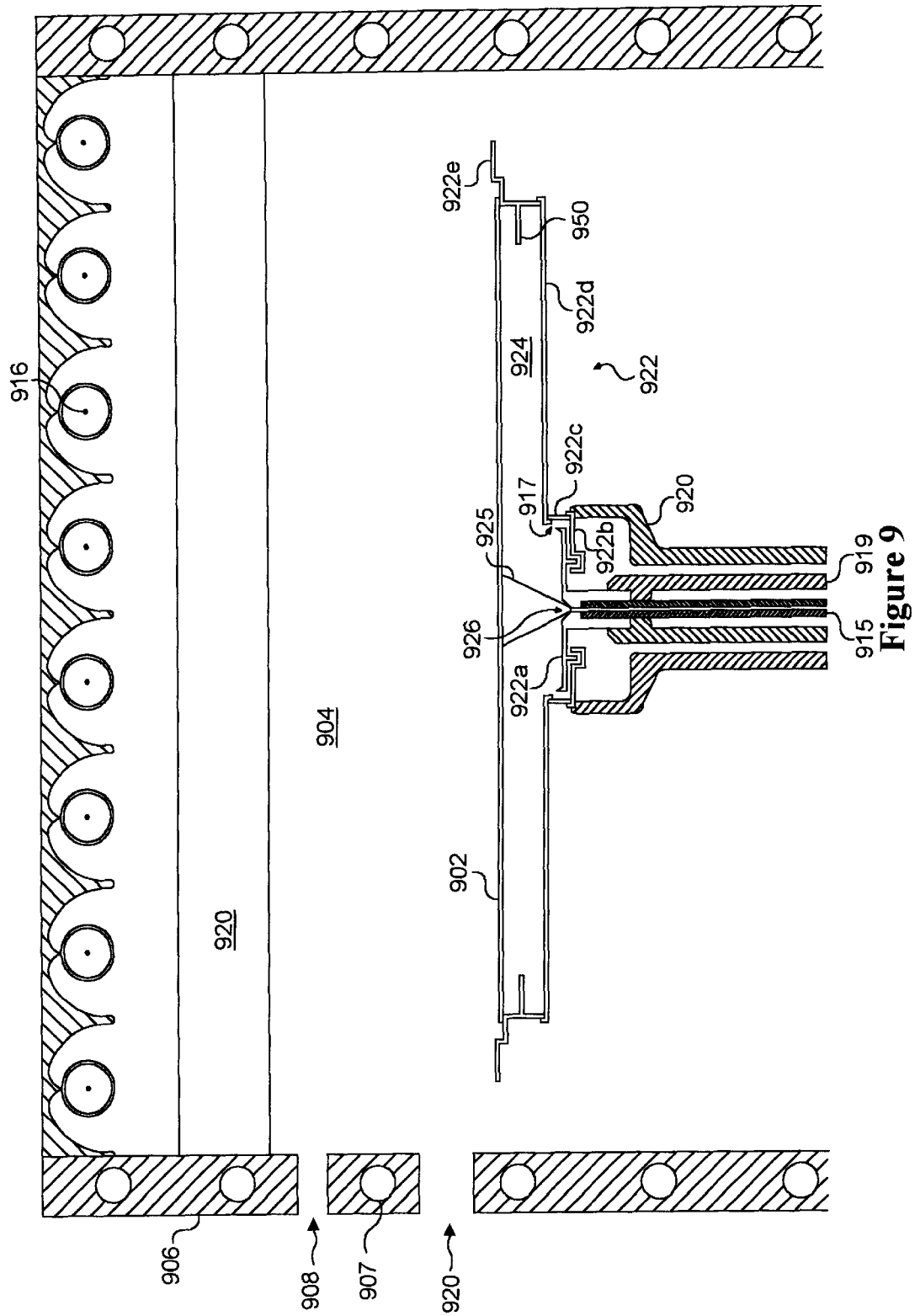

THERMAL PROCESSING SYSTEM WITH SUPPLEMENTAL RESISTIVE HEATER AND SHIELDED OPTICAL PYROMETRY

BACKGROUND OF THE INVENTION

1. Field of the Invention

The field of the present invention relates in general to semiconductor processing. More particularly, the field of the invention relates to a system and method for detecting and measuring semiconductor substrate properties, such as temperature, temperature uniformity, and emissivity, using optical pyrometry.

2. Background

In rapid thermal processing (RTP) of semiconductor device materials (such as a semiconductor wafer or other substrate), one of the critical process parameters is temperature. Repeatable, precise, and process-independent measurements of the wafer temperature are among the most important requirements of semiconductor processing equipment (such as RTP) in integrated circuit manufacturing.

Contact temperature sensors, such as thermocouples and thermistors, are commonly used to measure temperature. However, these sensors are not well-suited to many wafer processing environments. Such temperature sensors typically must be placed in contact with a wafer which may affect the uniformity of heating and expose the wafer to contaminants under certain conditions. In addition, it is difficult to achieve repeatable temperature measurement conditions due to inconsistent contact areas and other variations in heat transfer to the sensor.

As a result, noninvasive temperature measurement techniques, such as optical pyrometry, have been used in many RTP systems. Unlike temperature measurement using contact sensors, such as thermocouples and thermistors, temperature measurement using optical pyrometry does not require contact with the wafer and as a result does not expose the wafer to metallic contaminants during processing. Optical pyrometers may determine temperature based upon optical electromagnetic radiation (hereinafter "light") emitted from an object. Optical pyrometers typically use a high temperature optical fiber, light pipe, lens, or other light collecting device to transmit light to a light sensitive device that measures the flux density or intensity of the light emitted by the object. See, e.g., U.S. Pat. No. 4,859,079 to Wickerstein et al. and U.S. Pat. Nos. 4,750,139 and 4,845,647 to Dils et al., each of which is incorporated herein by reference. The temperature is then determined using Planck's equation which defines the relationship between the temperature of an object, the flux density of light being emitted from that object, and the light emitting characteristics of the object's surface (emissivity).

The advantages of optical pyrometry for RTP include its noninvasive nature and relatively fast measurement speed which is critical in controlling the rapid heating and cooling in RTP. However, accurate optical temperature measurement using pyrometry depends upon the accurate measurement of the flux density of light emitted from the wafer and upon the wafer's light emitting characteristics or emissivity. Emissivity is typically wafer dependent and depends on a range of parameters, including temperature, chamber reflectivity, the wafer material (including dopant concentration), surface roughness, and surface layers (including the type and thickness of sub-layers), and will change dynamically during processing as layers grow on the surface of the wafer.

Among other things, the emissivity of a semiconductor wafer depends upon the wavelength of light that is being measured. FIG. 1 is a graph of emissivity as a function of wavelength and temperature for a pure silicon wafer. As shown in FIG. 1, emissivity is temperature dependent and may vary greatly at wavelengths greater than the absorption band of silicon, which is slightly less than one and two tenths (1.2) micrometers. The effects of emissivity with respect to temperature on optical pyrometry for silicon can be minimized by using a sensor with maximum sensitivity within a range of about eight tenths (0.8) to about one and one tenth (1.1) micrometers wavelength, as indicated at 100 in FIG. 1. See also U.S. Pat. No. 5,166,080 to Schietinger et al. which is incorporated herein by reference. However, the wavelength/emissivity characteristic of a wafer will differ for doped silicon and other semiconductor materials such as gallium arsenide. In addition, the emissivity of a given wafer will typically change during processing as materials, such as silicon dioxide, are deposited on the wafer surface. Therefore, it is very difficult to control the effects of emissivity on temperature measurement based solely upon the wavelength of light that is used for pyrometry.

A short wavelength less than one (1) micrometer is often preferred for optical pyrometry since it provides certain benefits. For instance, a short wavelength improves the sensitivity of the temperature measurement which is based on Planck black-body emission. Sensitivity is defined as the fractional change in radiance per fractional change in temperature and from the equations for Planck black-body emission it can be shown that sensitivity is inversely proportional to wavelength. Therefore, shorter wavelengths are preferred for improved sensitivity in temperature measurement.

However, the ability to use a short wavelength of light in optical pyrometry is severely limited in many conventional rapid thermal processors due to interference from radiant energy heating sources. The heat needed for RTP is typically provided by a heating lamp module which consists of high intensity lamps (usually tungsten-halogen lamps or arc lamps). FIG. 2 illustrates a conventional RTP processing chamber, generally indicated at 200, using two banks of heating lamps 202 and 203 to heat a semiconductor wafer 204 through optical windows 206 and 207. An optical pyrometer 208 may be used to measure the wafer temperature by detecting the flux density of light within cone of vision 210. However, most radiant energy heating sources, including tungsten filament and arc lamp systems, provide their peak energy intensity at a wavelength of about one micrometer which interferes with optical pyrometer 208. Optical pyrometer 208 will detect light reflected off of wafer 204 from heating lamps 202 and 203 as well as light emitted from the wafer. This reflected lamp light erroneously augments the measured intensity of light emitted from the wafer surface and results in inaccurate temperature measurement.

Therefore, some conventional systems have used a longer wavelength of light to measure temperature so that the spectral distribution of the heating lamps has minimal overlap with the pyrometer's operating spectral band or wavelength. However, measuring the intensity of emitted light at a longer wavelength to reduce interference can lead to similar interference problems from light emitted by hot chamber surfaces which, at longer wavelengths, becomes significant enough to cause errors in the measured light intensity. For instance, quartz, which is typically used in RTP processing chambers, re-emits light predominantly at longer wavelengths (typically greater than 3.5 micrometers). An alternative approach is to measure and compensate for reflected light. Two optical pyrometers may be used—one for measuring the light from the lamps and one for measuring the light from the wafer. The strength of the characteristic AC ripple in light emanated from the lamp can be compared to the strength of the AC ripple reflected from the wafer to determine the wafer's reflectivity. This, in turn, can be used to essentially subtract out reflected light in order to isolate the emitted light from the wafer for determining temperature using Planck's equation. See, e.g., U.S. Pat. No. 5,166,080 to Schietinger et al. However, such systems may require complex circuitry to isolate the AC ripple and perform the calculations that effectively eliminate reflected light. Such systems also require an additional light pipe and other components.

FIG. 3A illustrates an RTP processing chamber, generally indicated at 300, with a single set of heating lamps 302 for heating wafer 304. Typically, wafer 304 is supported by low thermal mass pins (not shown). An optical pyrometer 308 may be placed behind the wafer opposite the heating lamps 302. This reduces, but does not eliminate, the interference from lamps 302. In addition, wafer 304 may remain at least partially transparent to lamp radiation in the infrared region (beyond 1.5 micrometers) at lower wafer temperatures (below 600° C.) so pyrometer 308 may still be affected by lamp radiation or radiation re-emitted from quartz that is transmitted through wafer 304. FIG. 4 is a graph of silicon wafer transmission as a function of wavelength at a temperature of twenty five degrees Celsius (25° C.). As can be seen, silicon transmission is greatly reduced for wavelengths less than about one and two hundredths (1.02) micrometers. Therefore, transmission problems can be substantially eliminated by using short wavelengths (which also provide advantages for emissivity and sensitivity as described above), but interference from heating lamps 302 is also greatest at such wavelengths.

FIG. 3B illustrates an alternative single-sided lamp RTP processing chamber, generally indicated at 350. This processing chamber 350 includes a backside shield 352 for preventing deposition on the backside of wafer 354. This is desirable in many processing applications including chemical vapor deposition (CVD). In contrast, systems that use only low thermal mass pins to support the wafer allow material to be deposited everywhere on the wafer, including the backside which is exposed. Preventing such backside deposition usually simplifies the overall semiconductor device fabrication process. As shown in FIG. 3B, such systems may use an optical pyrometer 356 aimed at the backside shield to measure the approximate wafer temperature. While the shield eliminates wafer transmission problems, it also reduces the accuracy of temperature measurement since it is the temperature of the shield, and not the wafer, that is actually being measured.

For both double-sided and single-sided lamp RTP systems, additional problems may be introduced if the optical pyrometer samples emitted light through a window or lens that is exposed to the processing chamber. During certain processes, deposits may form on the window or lens which inhibit the transmission of light to the optical pyrometer. The optical pyrometer will sense less light due to the deposits and produce a temperature measurement that is lower than the actual temperature of the wafer. This may cause the lamp control system to erroneously increase the heat provided to the chamber to compensate for the falsely detected low temperature measurement. As the heat is increased, deposits may accelerate leading to thermal runaway conditions.

Another approach to compensating for the effects of emissivity on temperature measurement is to use a reflective cavity. A processing chamber may be designed to reflect emitted light from remote, highly reflective walls. The emitted light is radiated diffusely and reflected over the entire wafer numerous times. The effective emissivity of the wafer in such a system is determined by integrating the reflected light intensity over the wafer surface. By using a high aspect ratio for the reflective cavity, the effective emissivity of a wafer is increased toward unity which helps eliminate the effects of edges, device patterns on the wafer, and backside roughness. However, such an approach restricts chamber geometry and may not be practical in cold wall RTP chambers. The reflective cavity approach typically treats the wafer as an extension of the chamber wall. However, a wafer should not make contact with, or be too closely spaced to, a cold wall in RTP systems to avoid uneven cooling at the wafer edges. Further, reflective walls may interfere with rapid cooling in RTP systems which may require walls that rapidly absorb energy rather than reflect it. In addition, deposits may form on reflective walls during some processes which may diminish reflectivity and thereby introduce error into the temperature measurement.

Another approach is to place a small black-body enclosure around the tip of an optical sensor. The black-body enclosure heats up to the approximate temperature of the surrounding environment and emits light into the optical sensor that is proportional to the temperature of the black-body enclosure. However, such an approach measures the temperature of the black-body emitter and not the wafer. As with thermocouples, such an approach typically requires that the temperature sensor be placed in contact with the wafer, and repeatable accurate temperature measurements are difficult to achieve under actual processing conditions.

Yet another approach for measuring wafer temperature and compensating for emissivity uses an infrared laser source that directs light into a beam splitter. From the beam splitter, the coherent light beam is split into numerous incident beams which travel to the wafer surface via optical fiber bundles. The optical fiber bundles also collect the reflected coherent light beams as well as radiated energy from the wafer. In low temperature applications, transmitted energy may be collected and measured as well. The collected light is then divided into separate components from which radiance, emissivity, and temperature may be calculated. See, e.g., U.S. Pat. No. 5,156,461 to Moslehi et al. It is a disadvantage of such systems that a laser and other complex components are required. Such systems, however, are advantageous because they may provide measurements of wafer temperature at multiple points along the wafer surface which may be useful for detecting and compensating for temperature nonuniformities.

Advanced fabrication processes demand uniform temperature across the wafer with gradients preferably less than plus or minus two degrees Celsius (±2° C.) to provide for uniform processing and to avoid thermal induced stress which may cause crystal slip in the wafer. However, RTP typically requires low thermal mass to allow for rapid heating and cooling. Such systems use a cold-wall furnace with radiant energy sources to selectively heat the wafer. While this allows rapid heating and cooling, the temperature uniformity becomes sensitive to the uniformity of the optical energy absorption as well as the radiative and convective beat losses of the wafer. Wafer temperature non-uniformities usually appear near wafer edges because radiative heat losses are greatest at the edges. During RTP the wafer edges may, at times, be several degrees (or even tens of degrees) cooler than the center of the wafer. The temperature nonuniformity may produce crystal slip lines on the wafer (particularly near the edge). Slip lines are collections of dislocations in the crystal lattice structure of the silicon caused by unequal movement of atomic planes due to thermally induced stress. This may result in the formation of electrically active defects which degrade the circuitry and decrease yield. Therefore, a system for detecting and correcting temperature differences across the wafer is often required. In particular, accurate, multi-point optical pyrometry is desirable for detecting temperature differences which can then be corrected.

Correction or compensation for temperature nonuniformities has been provided using several techniques. One approach is to use a multi-zone lamp system arranged in a plurality of concentric circles. The lamp energy may be adjusted to compensate for temperature differences detected using multi-point optical pyrometry. However, such systems often require complex and expensive lamp systems with separate temperature controls for each zone of lamps. Another approach has been to place a ring of material (such as silicon or the like) around, and in contact with, the periphery of the wafer. The ring provides extra thermal insulation to retain heat at the periphery of the wafer, but typically does not offer sufficient flexibility over a wide range of temperatures.

What is needed is an RTP processing chamber with an accurate optical pyrometry system for measuring semiconductor substrate temperature. Preferably such a system would provide optical pyrometry at short wavelengths without interference from direct lamp light or reflected or re-emitted light from chamber surfaces. Further, such a system would preferably be emissivity insensitive to allow accurate temperature measurement in a variety of processes using different semiconductor materials, dopants, and layers and would not require complex emissivity and reflectivity measurement and compensation systems as do many conventional approaches. In addition, such a system would preferably allow an optical pyrometer to measure the intensity of emitted light without interference from coatings or other obstructions on windows which may lead to thermal runaway conditions.

What is also needed is an RTP processing system and method for preventing undesired backside deposition. Preferably, such a system would prevent backside deposition on a semiconductor substrate while still allowing direct multi-point temperature measurement. What is also needed is a system and method for detecting and correcting temperature differences across a semiconductor substrate due to edge losses without requiring complex multi-zone lamp systems. Preferably, each of these features would be combined in a single, cost-effective RTP processing system and method.

SUMMARY OF THE INVENTION

A first aspect of the present invention provides a semiconductor substrate processing system and method using shielded optical pyrometry to prevent interference from extrinsic light. Preferably, a shield is positioned relative to a semiconductor substrate such that a shielded region is formed between the surfaces of the substrate and the shield. The shield and the substrate substantially prevent reflected light within a given range of wavelengths from entering the region and interfering with the optical pyrometry. The intensity of light within the given range of wavelengths emitted by the semiconductor substrate into the region may then be sampled to measure substrate temperature and to detect temperature differences across the substrate surface. It is an advantage of these and other aspects of the present invention that interference with optical pyrometry due to reflected light within the processing chamber or coatings on the windows and walls is substantially eliminated.

Another aspect of the present invention provide a shield and a semiconductor substrate that are substantially non-transmissive to light within the given range of wavelengths at processing temperatures. It is an advantage of this aspect of the present invention that interference with optical pyrometry due to light transmitted through the substrate or shield into the shielded region is substantially eliminated.

It is a further advantage of the above aspects of the present invention that the shielded region may be formed to approximate an ideal cavity radiator under many processing conditions with an effective emissivity approaching unity. Thus, temperature may be accurately measured substantially independently of the intrinsic emissivity of the semiconductor substrate which may vary across materials and temperatures. It is a further advantage that short wavelength radiant energy heating sources may be used in conjunction with short wavelength optical pyrometry without interference from reflected and transmitted light.

Another aspect of the present invention provides a shield that substantially prevents reactive gas (or other substances) from entering the shielded region and forming deposits on an optical sensor, or a window for an optical sensor, which is used to sample the intensity of emitted light within the shielded region. It is an advantage of this aspect of the present invention that the intensity of light may be sampled without interference from deposits on an optical sensor or window for an optical pyrometer.

Yet another aspect of the present invention provides a shield that substantially prevents reactive gas (or other substances) from entering the shielded region and forming deposits on semiconductor substrate surfaces within the shielded region. It is an advantage of this aspect of the present invention that undesired deposition on the backside of the semiconductor substrate may be substantially prevented. It is a further advantage that dynamic changes in the emissivity of the semiconductor substrate due to the deposition of backside layers are avoided.

Another aspect of the present invention provides a heater and/or thermal insulation to compensate for temperature differences and uneven heat losses across the substrate surface. In particular, the heat provided by heaters, such as resistive heaters and lamp modules, may be adjusted to provide uniform heating in response to the intensity of light sampled at various points across the substrate surface. In particular, emitted light from the substrate may be sampled at various locations within a shielded region as described above. It is an advantage of these and other aspects of the present invention that a more uniform substrate temperature may be achieved.

Yet another aspect of the present invention provides a shield having rotating and non-rotating portions. The rotating portion may be used to rotate the semiconductor substrate during processing and the non-rotating portion may be used to support an optical sensor that samples emitted light within the shielded region. It is an advantage of this aspect of the present invention that a shielded region may be used to block extrinsic light from interfering with optical pyrometry, while still allowing the substrate to rotate during processing to provide more uniform heating. Rotation of the semiconductor substrate is desired because it reduces the impact of localized heating irregularities on the substrate by spreading the effect of such irregularities across a circumference of the substrate surface. Rotation also enhances the uniformity of layers deposited on the substrate by evening out localized irregularities which may be caused by, among other things, uneven gas flow distribution across the substrate surface.

BRIEF DESCRIPTION OF THE DRAWINGS

These and other features and advantages of the present invention will become more apparent to those skilled in the art from the following detailed description in conjunction with the appended drawings in which:

FIG. 8 is a side cross sectional view of a rapid thermal processing chamber having a plurality of optical sensors according to an alternative embodiment of the present invention;

FIG. 9 is a side cross sectional view of a rapid thermal processing chamber with additional thermal insulation at the edge of a wafer according to an alternative embodiment of the present invention.

DETAILED DESCRIPTION

One aspect of the present invention allows the temperature, temperature uniformity, and emissivity of a semiconductor substrate to be accurately detected and measured using optical pyrometry. The following description is presented to enable any person skilled in the art to make and use the invention. Descriptions of specific designs are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
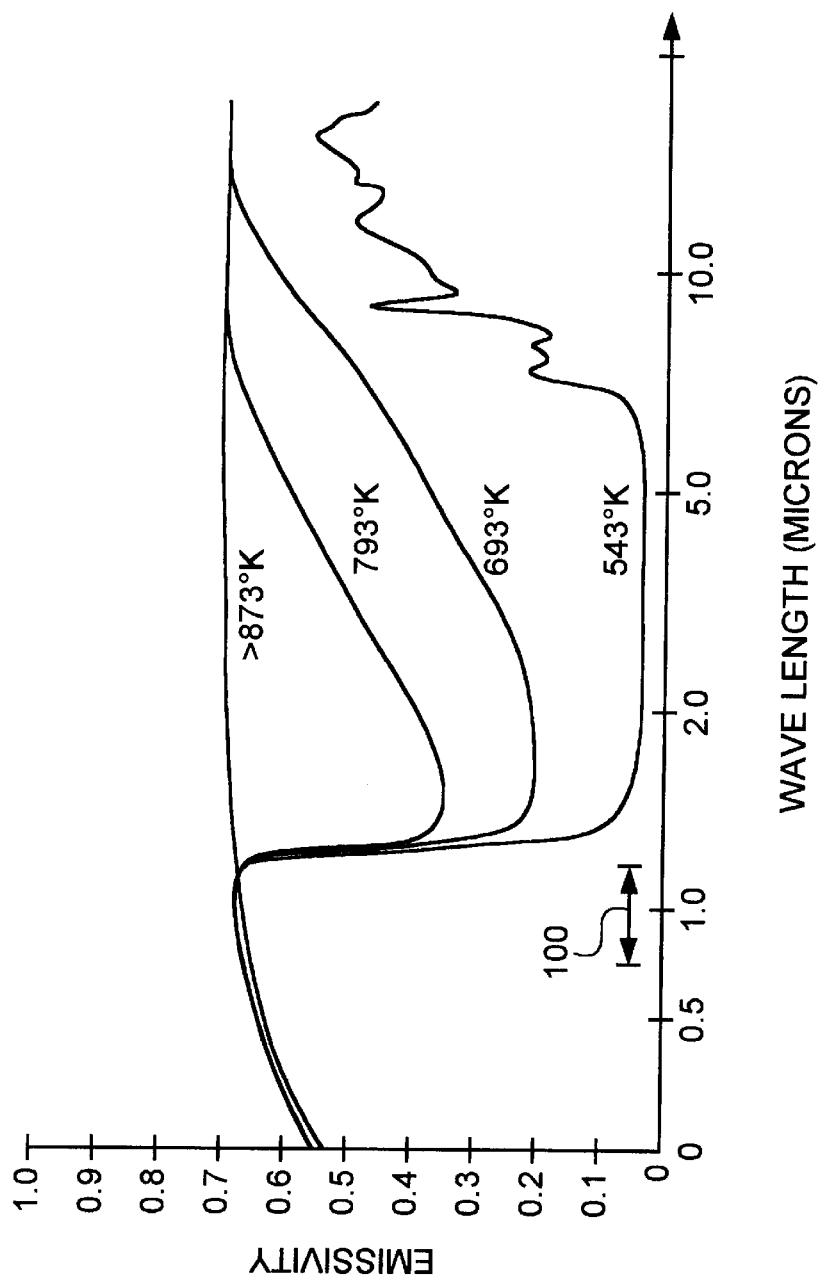
FIG. 1 is a prior art graph with a vertical axis for emissivity, a horizontal axis for wavelength, and a series of plotted curves illustrating the emissivity of silicon at a given temperature for various wavelengths of light.
Figure 2:
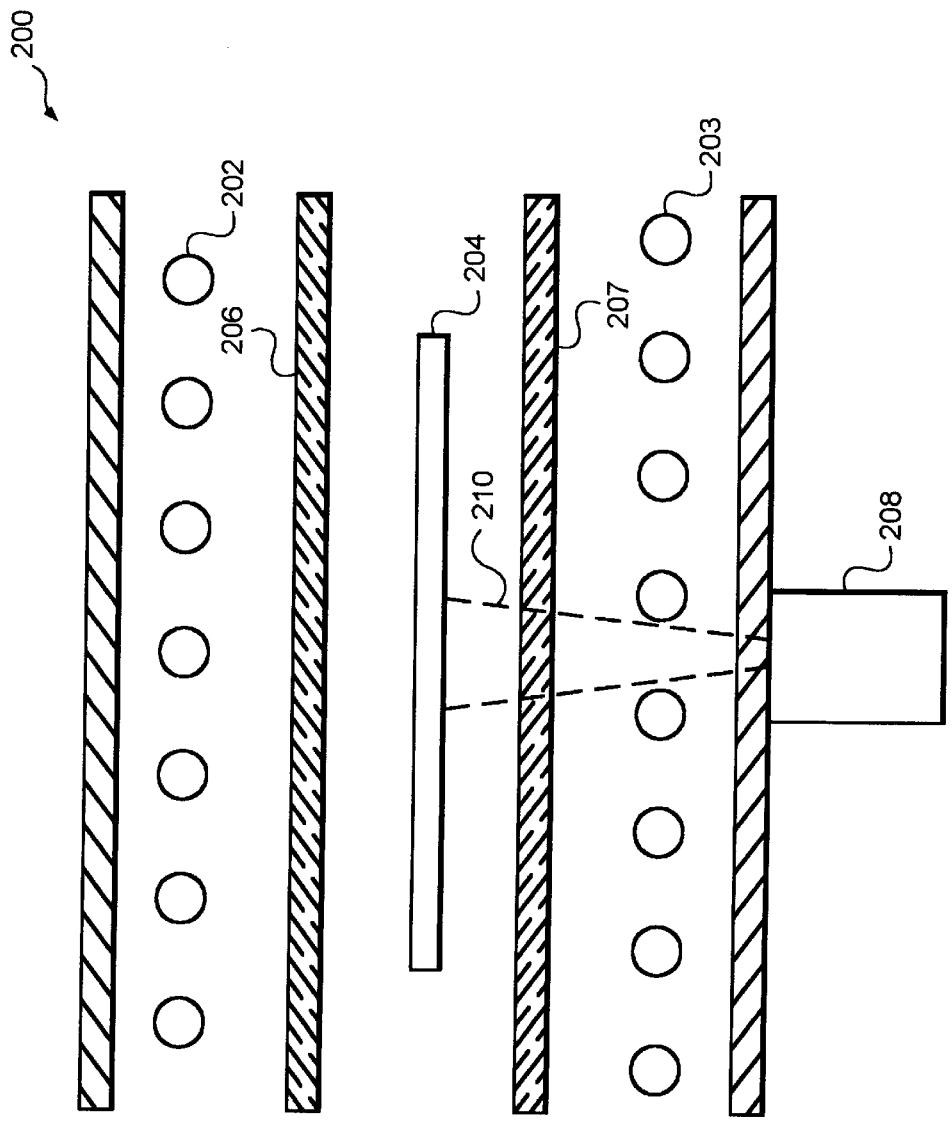
FIG. 2 is a side cross sectional view of a prior art rapid thermal processing chamber having heating lamps on both sides of a wafer.
Figure 3A:
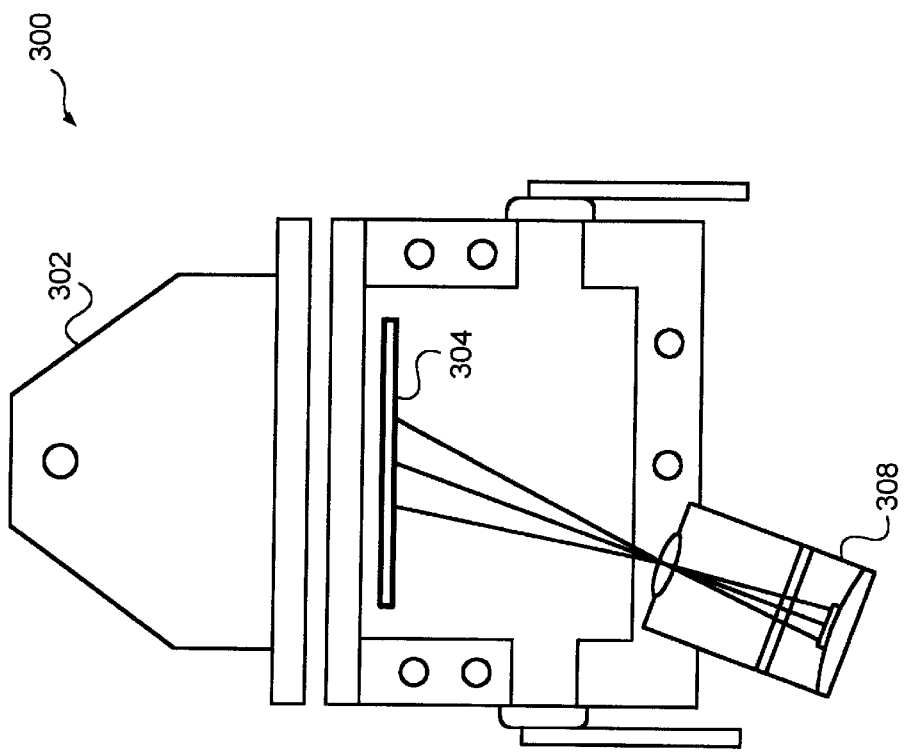
FIG. 3A is a side cross sectional view of a prior art rapid thermal processing chamber having heating lamps on the top side of a wafer.
Figure 3B:
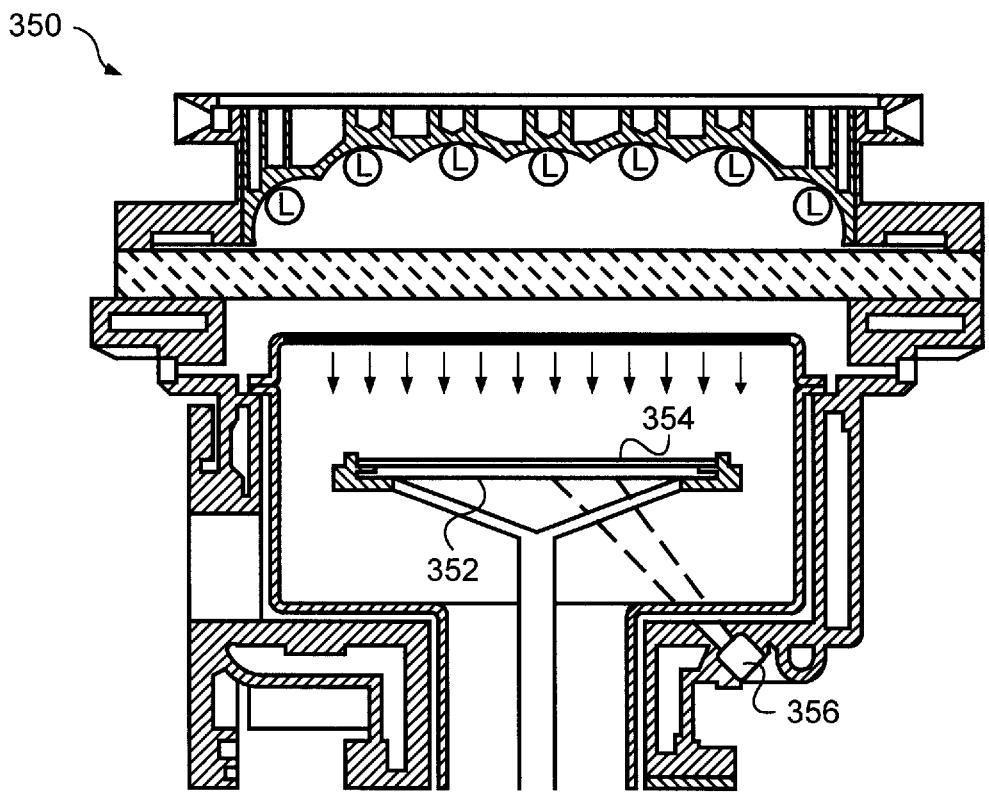
FIG. 3B is a side cross sectional view of a prior art rapid thermal processing chamber having heating lamps on one side of a wafer and a shield preventing deposition on the other side of the wafer.
Figure 4:
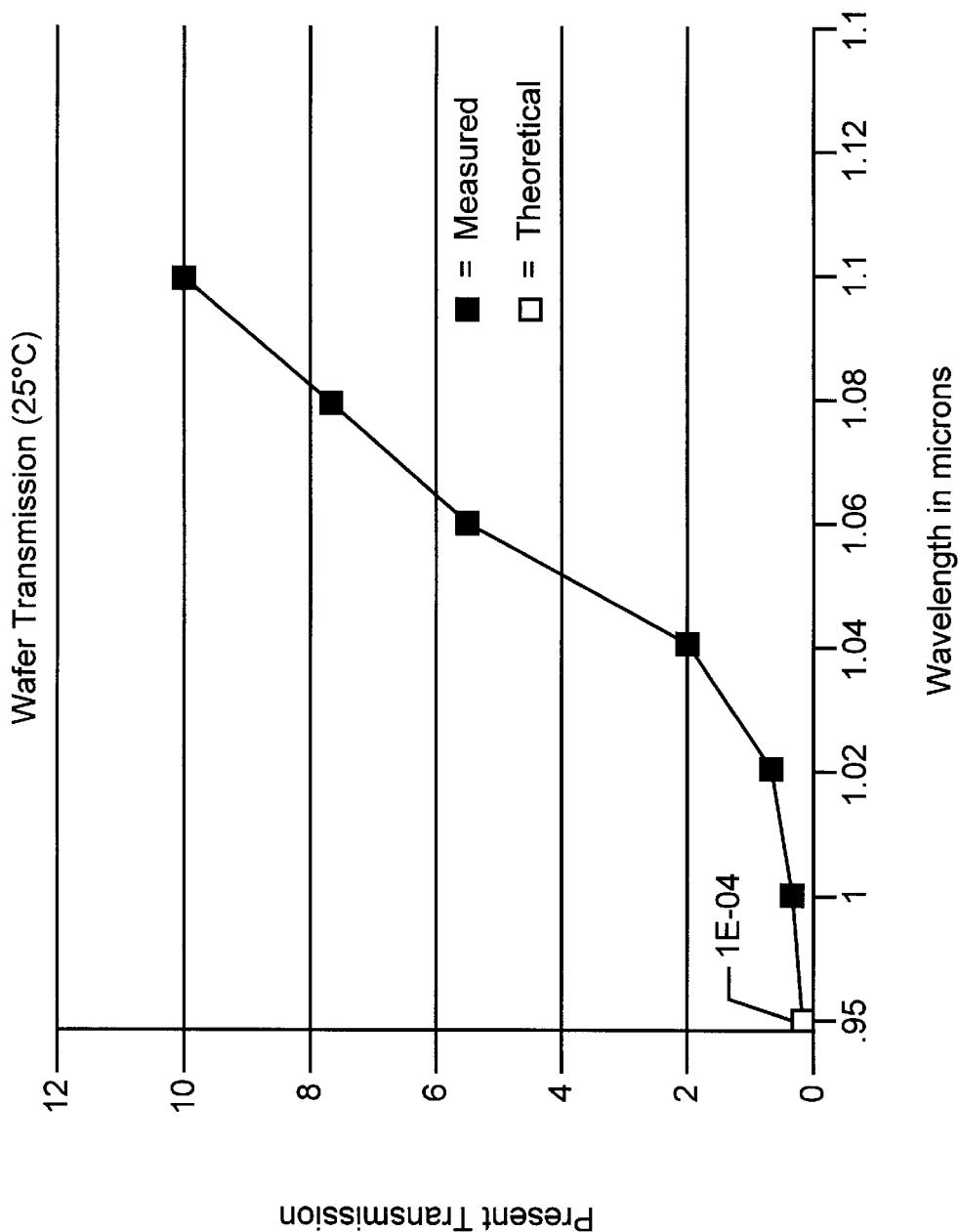
FIG. 4 is a prior art graph with a vertical axis for transmission, a horizontal axis for wavelength, and a plotted curve illustrating the transmission of a silicon wafer at twenty five degrees Celsius (25° C.) for various wavelengths of light.
Figure 5:
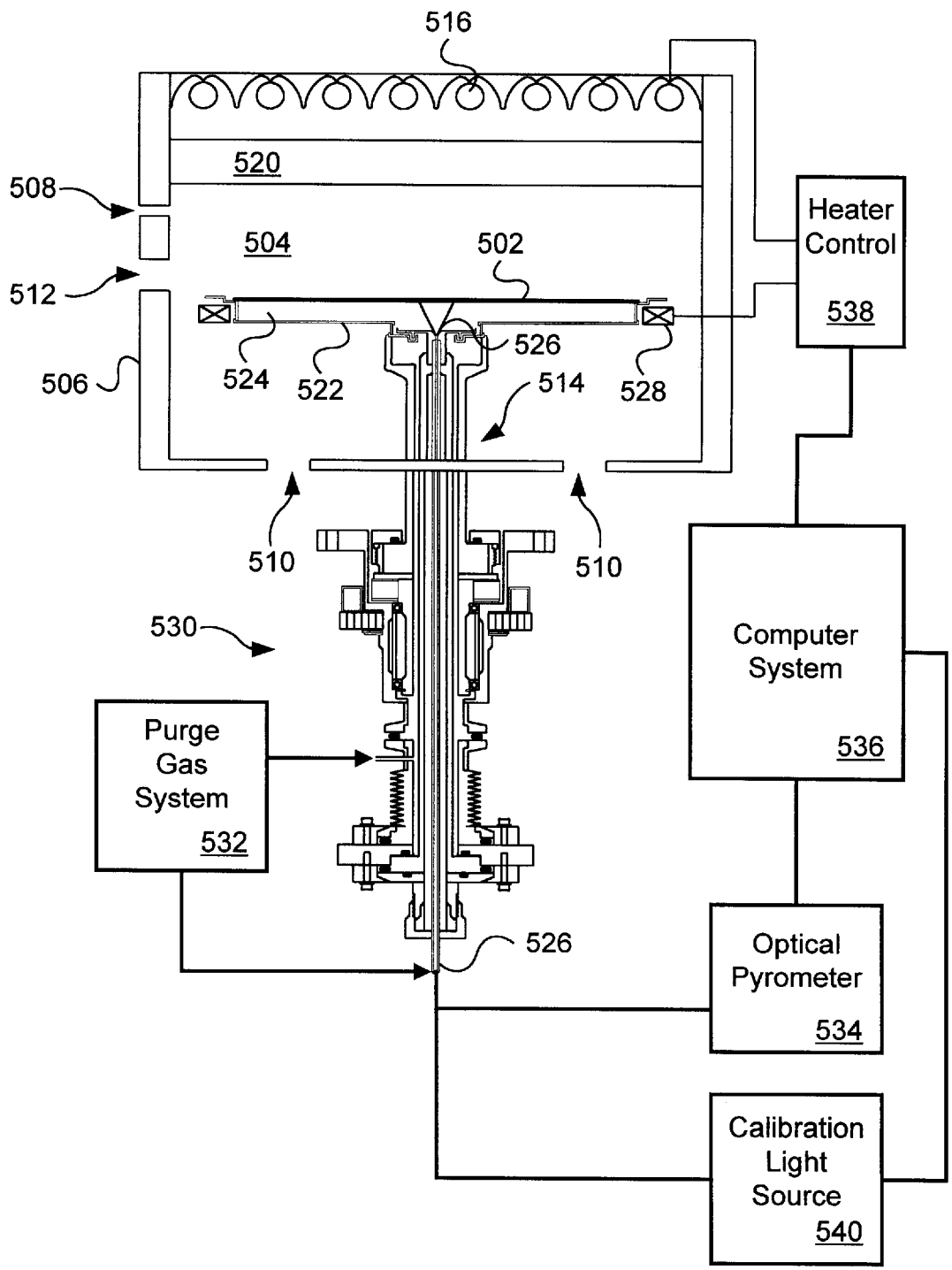
FIG. 5 is a partial cross sectional view and a partial block diagram of a rapid thermal processing system according to a first embodiment of the present invention.

Referring to FIG. 5, in the first embodiment, a semiconductor wafer 502 or other semiconductor substrate is placed in an RTP processing chamber 504 for processing. Processing chamber 504 is enclosed by walls 506. The walls 506 form several openings into the chamber including an inlet 508 for reactive gas (or other substances for forming deposits or otherwise processing the wafer), an outlet 510 for a gas exhaust system, a passage 512 forming part of a load lock mechanism for loading and unloading wafer 502, and a hole 514 through which a wafer support mechanism may enter chamber 504. Lamps 516 or other radiant energy heating sources radiate through window 520 to heat wafer 502. A radiation shield 522 is placed adjacent to the wafer to form a cavity 524. During processing, radiation shield 522 and wafer 502 substantially block all direct and reflected light at the wavelengths used by the optical pyrometer from entering cavity 524. The wafer and radiation shield are preferably selected from a material that has low transmission at the wavelengths used by the optical pyrometer for the desired processing temperatures. Therefore, the light in the cavity at the wavelengths used by the optical pyrometer is substantially limited to light emitted from the semiconductor wafer and radiation shield. An optical sensor 526, such as a light pipe or optical fiber, may be introduced into cavity 524 through a small aperture to sample the emitted light. In particular, in the first embodiment light emitted at low wavelengths less than three and one half (3.5) micrometers (and preferably less than one and two tenths (1.2) micrometers) may be collected at one or more points of the wafer surface within the cavity and transmitted to an optical pyrometer. Direct interference from the lamps at these wavelengths is blocked by the radiation shield and wafer.

The cavity formed by the radiation shield and wafer approximates an ideal black-body cavity radiator. An ideal cavity radiator consists of a cavity within a body where the walls of the cavity are held at a uniform temperature. Thermal radiation within an ideal cavity, called cavity radiation, has a simple spectrum whose nature is determined only by the temperature of the walls and not in any way by the material of the cavity, its shape, or its size. That is, the effective emissivity within an ideal cavity radiator is always equal to one (1).

A black-body cavity is approximated in the first embodiment by placing radiation shield 522 adjacent to wafer 502 which causes the effective emissivity within cavity 524 to approach unity substantially independently of the materials used. Thus, different semiconductor materials with different emissivity values or deposited layers may be used within the first embodiment without substantially affecting the accuracy of temperature measurements. In addition, conventional problems associated with backside roughness and other coatings are substantially eliminated.

The radiation shield may also be used to prevent undesired backside deposition on a wafer surface and to prevent the emissivity of the wafer from changing due to the growth of layers on the backside of the wafer, which may be important to the extent that emissivity remains a factor in a system using aspects of the present invention. In addition, the number of layers or the thickness of the radiation shield may be varied along the radius of the wafer to provide varied thermal insulation to compensate for differences in wafer temperature due to heat losses at the periphery of the wafer. A peripheral heater 528 (such as a resistive ring heater), lamp modules, or other heater arranged about the periphery of the wafer may also be used to adjust for temperature differences in the first embodiment.

The system of the first embodiment also includes a variety of subsystems for controlling rapid thermal processing including a central support and drive mechanism 530, a purge gas system 532, an optical pyrometer 534, a computer system 536, and a heater control 538. The central support and drive mechanism 530 provides a support system for radiation shield 522 and optical sensor 526. The central support and drive mechanism 530 also provides a rotational drive for rotating the wafer during processing, as well as an elevational mechanism for raising and lowering the wafer for loading and unloading through passage 512. A purge gas system 532 introduces purge gas into the central support and drive mechanism 530 to prevent deposits from forming within the mechanism. The purge gas system 532 may use conventional gas dispersing techniques.

Optical sensor 526 samples the intensity of light within cavity 524 and provides an indication of the intensity to optical pyrometer 534. This sampling may be accomplished by transmitting light from the cavity to optical pyrometer 534 or by providing a signal to optical pyrometer 534 which corresponds to the sampled intensity. Optical pyrometer 534 is coupled to a computer system 536 for calculating temperature and controlling the RTP process. The optical pyrometer 534 and computer system 536 may calculate wafer temperature and, in certain embodiments, detect temperature differences across the wafer surface. Computer system 536 may then send a signal to heater control 538 to adjust the wafer temperature or correct for temperature differences. Heater control 538 then regulates the power to lamps 516 and peripheral heater 518 as indicated by computer system 536. It will be readily apparent to those skilled in the art that many conventional techniques may be used in optical pyrometer 534, computer system 536, and heater control 538; although the more stable effective emissivity of cavity 524 may be used to determine temperature rather than the wafer's intrinsic emissivity which may change dynamically during processing.

Although cavity 524 provides a relatively stable effective emissivity for temperature measurement, the system of the first embodiment may be equipped with a calibration light source 540 which may be used to measure the intrinsic emissivity of wafer 502. Although the effective emissivity of cavity 524 is substantially independent of the intrinsic emissivity of wafer 502 at thermal equilibrium, the intrinsic emissivity may be used to provide minor adjustments to enhance accuracy. Such adjustments may be desirable during temperature ramp up and ramp down when cavity 524 may not be at thermal equilibrium and as a result may deviate from ideal cavity radiator conditions. In addition, a measurement of a wafer's intrinsic emissivity may be stored and used by other processing chambers that subsequently process the wafer. The measured intrinsic emissivity should remain accurate after processing by the reactor of the first embodiment, since the radiation shield prevents backside layers from forming which might otherwise alter the intrinsic emissivity.

The intrinsic emissivity may be calculated by projecting light of a predetermined intensity from the calibration light source 540 through an optical fiber onto the backside of wafer 502 prior to rapid thermal processing. Reflected light may be collected by the optical fiber and measured by optical pyrometer 534 to determine the reflectivity and in turn the intrinsic emissivity of the wafer.

Aspects of the first embodiment provide a variety of advantages over conventional RTP processing and temperature measurement techniques. In the first embodiment, short wavelength optical pyrometry may be used without interference from radiant energy heating sources. Using wavelengths provides improved sensitivity in temperature measurement and also reduces interference from light transmitted through the wafer at low temperatures. In addition, the first embodiment allows temperature to be accurately measured without complex calculation of dynamic intrinsic wafer emissivity. Rather, aspects of the first embodiment substantially eliminate unpredictable dependencies upon a wafer's intrinsic emissivity which may vary across materials and temperature ranges and which may change as surface layers are deposited during processing. It is a further advantage of the first embodiment that undesired backside deposition from substances in the processing chamber (which may be provided for front side chemical or physical vapor deposition or sputtering) may be prevented. Multi-point pyrometry and adjustments for temperature non-uniformities may also be included in a system according to the present invention as described further below.

Figure 6A:
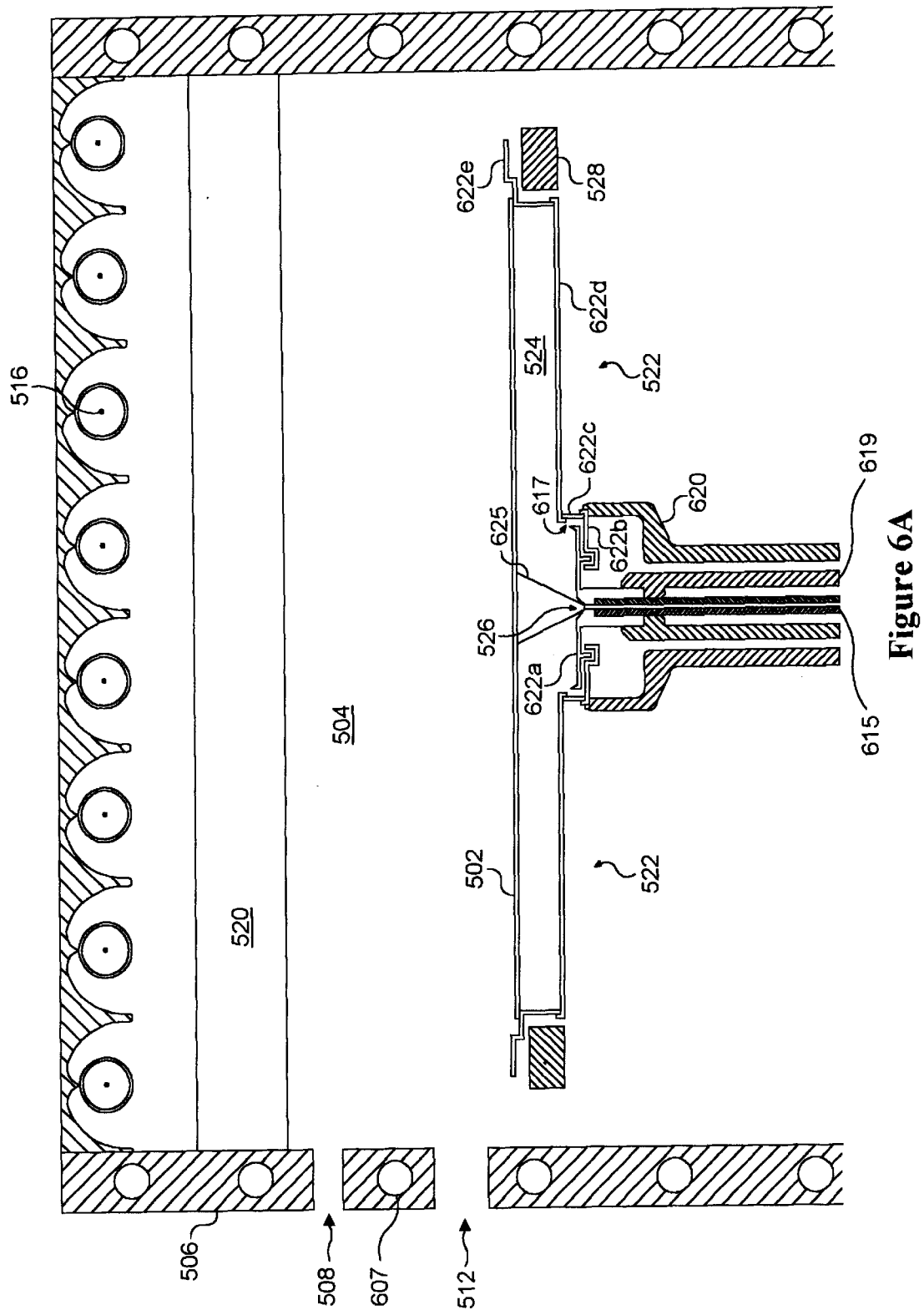
FIG. 6A is a side cross sectional view of a rapid thermal processing chamber according to the first embodiment of the present invention.
Figure 6B:
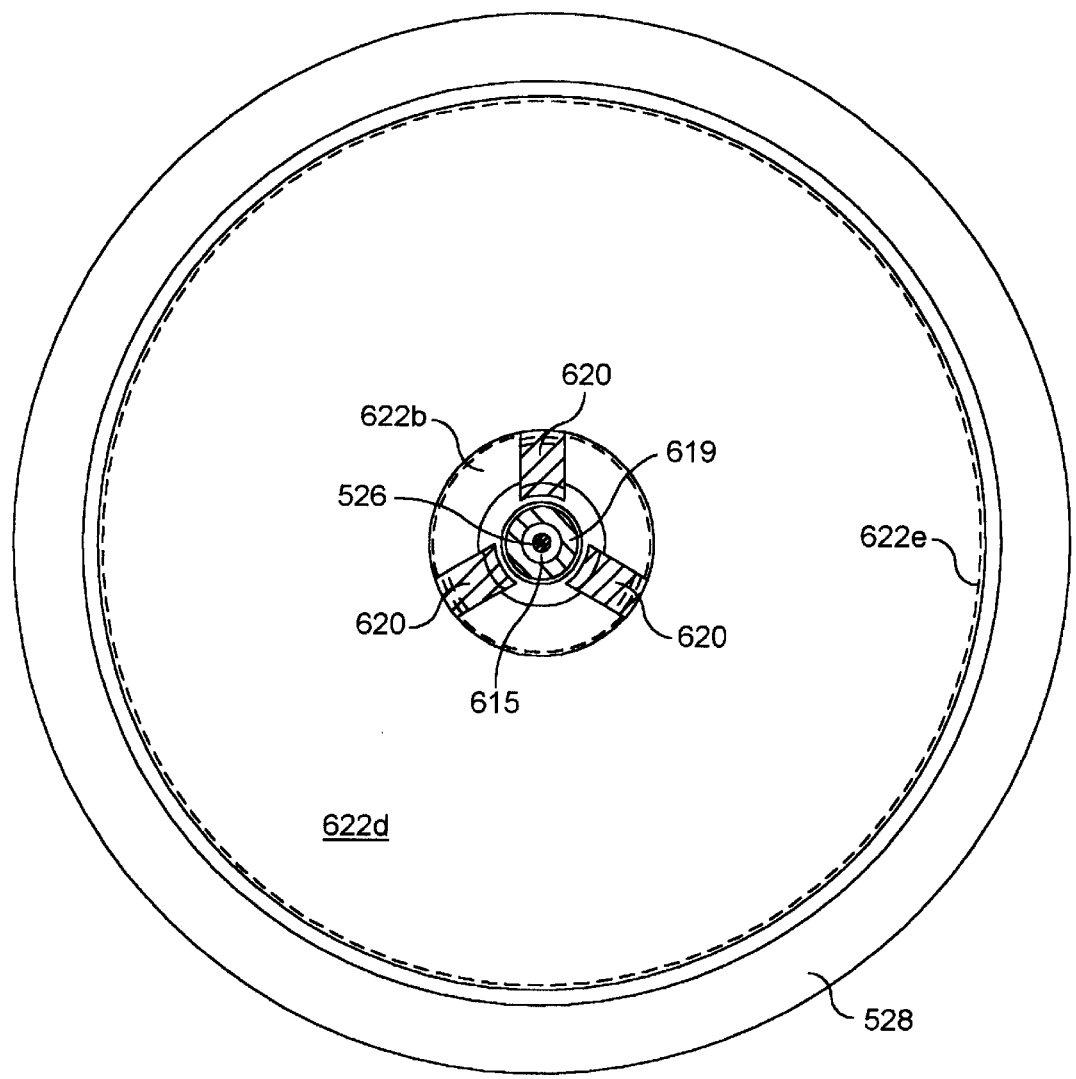
FIG. 6B is a bottom cross sectional view of a rapid thermal processing chamber according to the first embodiment.

The structure and operation of an RTP system according to the first embodiment of the present invention will now be described in further detail. FIG. 6A shows a side-cross sectional view of a rapid thermal processing reactor according to the first embodiment and FIG. 6B shows a bottom cross sectional view of a rapid thermal processing reactor according to the first embodiment. The reactor may be a cold-walled reactor with reactor walls 506 cooled by water cooling channels 607 or some other cooling system. A semiconductor wafer 502 is placed within the processing chamber 504 for rapid thermal processing. In the first embodiment, wafer 502 is a 200 millimeter silicon wafer. Wafer 502 may have materials deposited on it or be doped or coated with any variety of layers, including silicon dioxide, silicon nitride or the like. It will be readily apparent to those of ordinary skill in the art that aspects of the present invention may be applied to substrates having a variety of sizes and comprising a wide range of materials (including without limitation gallium arsenide, polycrystalline silicon, silicon carbide or the like). In fact, it is a major advantage that aspects of the present invention may be applied across a wide range of materials having different intrinsic emissivities.

As in many conventional systems, wafer 502 may be rapidly heated by radiant energy heating sources, such as lamps 516, positioned above the wafer 502 and outside of the processing chamber 504. Of course, in other embodiments radiant energy heating sources or other heaters could be placed above or below the wafer either inside or outside of the processing chamber. Light is radiated from lamps 516 through a quartz window 520 onto the top surface of wafer 502 thereby heating the wafer. In the first embodiment, the lamps 516 are conventional tungsten filament lamps or arc lamps which radiate predominantly at low wavelengths of approximately one (1) micrometer. Of course other heaters, such as longer wavelength sources or resistive heaters, may be used in conjunction with the first embodiment. Radiation from lamps 516 is reflected within the processing chamber 504 and is also absorbed by chamber surfaces including chamber walls 506, window 520 and wafer 502 as well as quartz liners (not shown) which may be used to protect and insulate the chamber walls. Light may be re-emitted from one or more of these surfaces at a variety of wavelengths, including longer wavelengths (greater than one and one half (1.5) micrometers). For instance, when heated to relatively low temperatures quartz window 520 re-emits light predominantly at wavelengths greater than three and one half (3.5) micrometers. Although the processing chamber may contain emitted and reflected light across a wide spectrum of wavelengths, aspects of the first embodiment allow the temperature of wafer 502 to be accurately measured using optical pyrometry.

In the first embodiment, a radiation shield 522 encloses the backside of wafer 502 forming a region such as cavity 524 that is shielded from light radiated from lamps 516 and light reflected off of chamber surfaces. As will be described in detail below, this region may be used to approximate an ideal black-body cavity radiator. An optical sensor 526 may be introduced into the shielded region to sample the intensity of emitted light in order to determine the temperature of wafer 502 using techniques of optical pyrometry.

In the first embodiment, the center piece 622a of the radiation shield 522 forms a small aperture that allows the optical sensor 526 to sample the intensity of light within cavity 524. The optical sensor may actually enter the cavity through the aperture or may be positioned outside the cavity and sample light that passes through the aperture. In the latter case, the aperture need not provide an opening and may simply be a small window transmissive to light of the wavelength used by the optical pyrometer. However, an aperture allowing the optical sensor to be directly exposed to light emitted from the wafer—without a window between the optical sensor and the wafer—is preferred to avoid interference from any deposits on the window or light emitted from the window. In embodiments where a window is used to sample the intensity of light within the cavity, the window is preferably shielded by the radiation shield or purged to prevent deposits from forming on the window.

In the first embodiment, the optical sensor 526 is preferably a sapphire light pipe in a coaxial purged sheath of silicon carbide 615 although a high temperature optical fiber may be used instead. Although a light pipe or optical fiber is used in the first embodiment, any variety of light collection, transmission and detection systems—including lens and mirror systems, photodetectors or the like—may be used in conjunction with aspects of the present invention. What is desired is an optical sensor that samples the intensity of light emitted within a shielded region. This sampling may be accomplished by collecting and transmitting light from the shielded region or by providing a signal corresponding to the sampled intensity. As will be readily apparent to those of ordinary skill in the art, the term "light" as used herein refers to electromagnetic radiation within the optical range and is not limited to visible light.

In the first embodiment, radiation shield 522 preferably comprises a material that will substantially block light from entering the cavity 524, particularly at wavelengths that are used by the optical pyrometer to determine temperature (which for the first embodiment are wavelengths less than three and one half (3.5) micrometers and are preferably in the range of eight tenths (0.8) to one and two tenths (1.2) micrometers). In addition, it is desirable to use a material for radiation shield 522 that has thermal properties similar to wafer 502. In particular, it is desirable to use a material capable of reaching substantial thermal equilibrium with wafer 502 within a short period of time relative to the period of time used for the processing steps. In particular, silicon composite materials may provide advantages when used for the radiation shield. In the first embodiment, the radiation shield comprises silicon carbide, although other materials such as graphite, silicon carbide coated graphite, silicon, and polycrystalline silicon may also be used. Silicon carbide has advantageous thermal properties and will not contaminate wafer 502 under most conditions. Silicon carbide has an intrinsic emissivity of approximately nine tenths (0.9) at most processing temperatures.

In the first embodiment, the radiation shield 522 also has a thickness over most of its area that is within a factor of three (3) of the thickness of wafer 502. In particular, radiation shield 522 has a thickness of approximately fifty thousandths (0.050) of an inch over most of its area in the first embodiment. Since radiation shield 522 has thermal properties similar to wafer 502 and a thickness on the order of the wafer thickness in the first embodiment, the radiation shield 522 heats up and attains thermal equilibrium within a time period substantially equal to the time required to heat wafer 502 to a desired processing temperature. Preferably, the temperature ramp up and ramp down time for radiation shield 522 should not lag the temperature ramp up and ramp down for wafer 502 by more than a short period of time that is substantially less than the period of time desired for processing wafer 502 at a given processing temperature (i.e. less than one tenth (0.1) the period of time for the processing step).

In the first embodiment, radiation shield 522 is assembled from five substantially annular or cylindrical pieces of silicon carbide, labeled 622a, 622b, 622c, 622d and 622e in FIGS. 6A and 6B, although it will be readily apparent to those of ordinary skill in the art that a wide range of configurations may be used for the radiation shield. What is desired in the first embodiment is a radiation shield that substantially prevents reflected light within the processing chamber from interfering with optical sensor 526. In the first embodiment, a center piece 622a is disposed radially about the optical sensor 526, and is supported by a quartz center support 619. The center piece 622a, center support 619, and optical sensor 526 are stationary in the first embodiment during processing; however, center piece 622a, center support 619, and optical sensor 526 may be raised and lowered as a unit to raise and lower wafer 502 for loading and unloading. Center piece 622a, center support 619, and optical sensor 526 may be raised approximately one half (0.5) inch above the outer portion 622e of the radiation shield. Wafer 502 may be loaded into the processing chamber 504 through a conventional load lock mechanism (not shown) through passage 512 and placed on the raised center piece 622a. The center piece 622a is then lowered which causes the wafer 502 to be placed as shown in FIG. 6A with edges resting on the outer piece 622e of the radiation shield. The center piece 622a is then lowered approximately six hundred and fifty thousandths (0.650) of an inch below the wafer 502 into the position shown in FIG. 6A for processing.

Figure 7A:
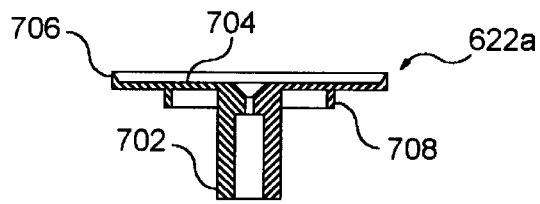
FIG. 7A is a side cross sectional view of a center piece for a radiation shield according to the first embodiment.
Figure 7B:
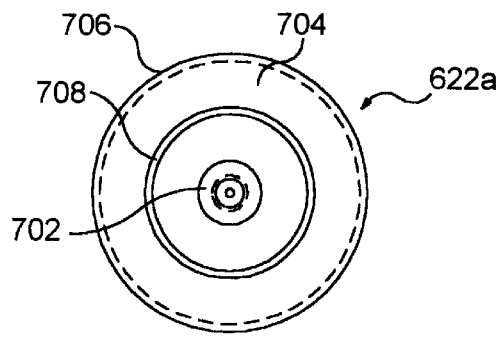
FIG. 7B is a bottom plan view of a center piece for a radiation shield according to the first embodiment.

FIG. 7A is a side cross sectional view, and FIG. 7B is a bottom plan view, of center piece 622a of the radiation shield. Referring to FIGS. 7A and 7B, the center piece 622a has a cylindrical sheath portion 702 that surrounds optical sensor 526 and rests on center support 619. The cylindrical sheath portion 702 extends approximately three fourths (0.75) of an inch in a direction substantially perpendicular to, and away from wafer 502. An annular ring portion 704 extends radially outward approximately seven tenths (0.7) of an inch from cylindrical sheath portion 702. The annular ring portion 704 terminates in an outer lip 706 which is used to support wafer 502 during loading and unloading. A cylindrical skirt 708 extends downward approximately one eighth (0.125) of an inch from the middle of annular ring portion 704. This cylindrical skirt 708 fits within a cylindrical slot formed by channel piece 622b of the radiation shield. As shown in FIG. 6A, the cylindrical skirt helps prevent light from entering cavity 524 while allowing pieces 622b, 622c, 622d, and 622e of the radiation shield and wafer 502 to rotate independently of center piece 622a, center support 619, and optical sensor 526.

Referring to FIGS. 6A and 6B, channel piece 622b of the radiation shield sits approximately sixty thousandths (0.060) of an inch below the center piece 622a during processing. This provides a channel 617 into cavity 524 between center piece 622a and channel piece 622b. The channel 617 is shaped with one or more ninety degree (90°) turns to help prevent external light from entering cavity 524. Each additional turn helps prevent light from reflecting into cavity 524. In the first embodiment, the channel has six (6) ninety degree (90°) turns. The channel 617 provides an exit path for any purge gases introduced into cavity 524. Even when purge gases are not used, the channel 617 substantially prevents deposits from forming inside cavity 524. The reactive gases are depleted within the narrow channel well before entering cavity 524. The channel 617 also allows pieces 622b, 622c, 622d, and 622e of the radiation shield and wafer 502 to rotate independently of center piece 622a, center support 619, and optical sensor 526. Channel piece 622b (and in turn pieces 622c, 622d, and 622e and wafer 502) are supported by a quartz rotating support 620. The rotating support 620 comprises three narrow legs as shown in FIG. 6B instead of a single solid cylinder in order to reduce thermal insulation which might otherwise interfere with the heating of wafer 502. The rotating support 620 rotates during processing at approximately twenty (20) rotations per minute. This in turn rotates wafer 502 which helps even out any non-uniformities in heating due to uneven intensities in lamps 516. In addition, rotation helps average out localized backside surface roughness and temperature irregularities that might affect the flux density detected by optical sensor 526 (which remains stationary during processing). Rotation also enhances the uniformity of layers deposited on the substrate by evening out localized irregularities which may be caused by, among other things, uneven gas flow distribution across the substrate surface.

Figure 7C:
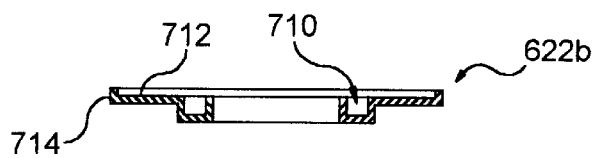
FIG. 7C is a side cross sectional view of a channel piece for a radiation shield according to the first embodiment.
Figure 7D:
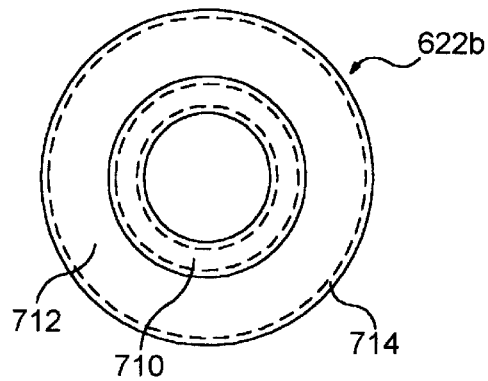
FIG. 7D is a bottom plan view of a channel piece for a radiation shield according to the first embodiment.

FIG. 7C is a side cross sectional view, and FIG. 7D is a bottom plan view, of channel piece 622b of the radiation shield. Referring to FIGS. 7C and 7D, a cylindrical slot 710 is formed by channel piece 622b which is shaped to receive cylindrical skirt 708 of center piece 622a. Channel piece 622b also comprises an annular ring portion 712 extending radially outward approximately four tenths (0.4) of an inch from cylindrical slot 710 and terminating in a lip 714. The lip 714 is used to hold cylindrical piece 622c of the radiation shield in place as shown in FIG. 6A. Cylindrical piece 622c is a cylinder of silicon carbide approximately fifty thousandths (0.050) of an inch thick and approximately three eighths (0.375) of an inch high. Cylindrical piece 622c is used to space center piece 622a and channel piece 622b of the radiation shield farther from wafer 502 than the rest of the radiation shield to avoid uneven heating in the center of wafer 502. Since center piece 622a overlaps channel piece 622b, the radiation shield provides better thermal insulation in its central region. To compensate for any effect this may have on the heating of wafer 502, this central region is spaced farther from the wafer than the rest of the radiation shield to reduce its impact on wafer heating. The distance from the wafer may be adjusted as necessary to allow for substantially uniform wafer heating. Alternatively, the center of the radiation shield may be constructed from thinner pieces of silicon carbide to reduce the effect of the overlapping pieces and provide a more uniform thermal insulation beneath the wafer.

On top of cylindrical piece 622c of the radiation shield is placed an annular ring piece 622d which extends radially outward substantially parallel to, and approximately three eighths (0.125) of an inch below, wafer 502. The annular ring piece 622d has a width of approximately fifty thousandths (0.050) of an inch. The annular ring piece 622d also has an inner downward lip to hold cylindrical piece 622c in place and an outer upward lip which holds the outer piece 622e of the radiation shield in place.

Figure 7E:
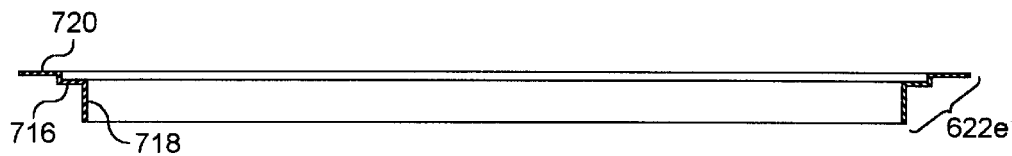
FIG. 7E is a side cross sectional view of an outer piece for a radiation shield according to the first embodiment.
Figure 7F:
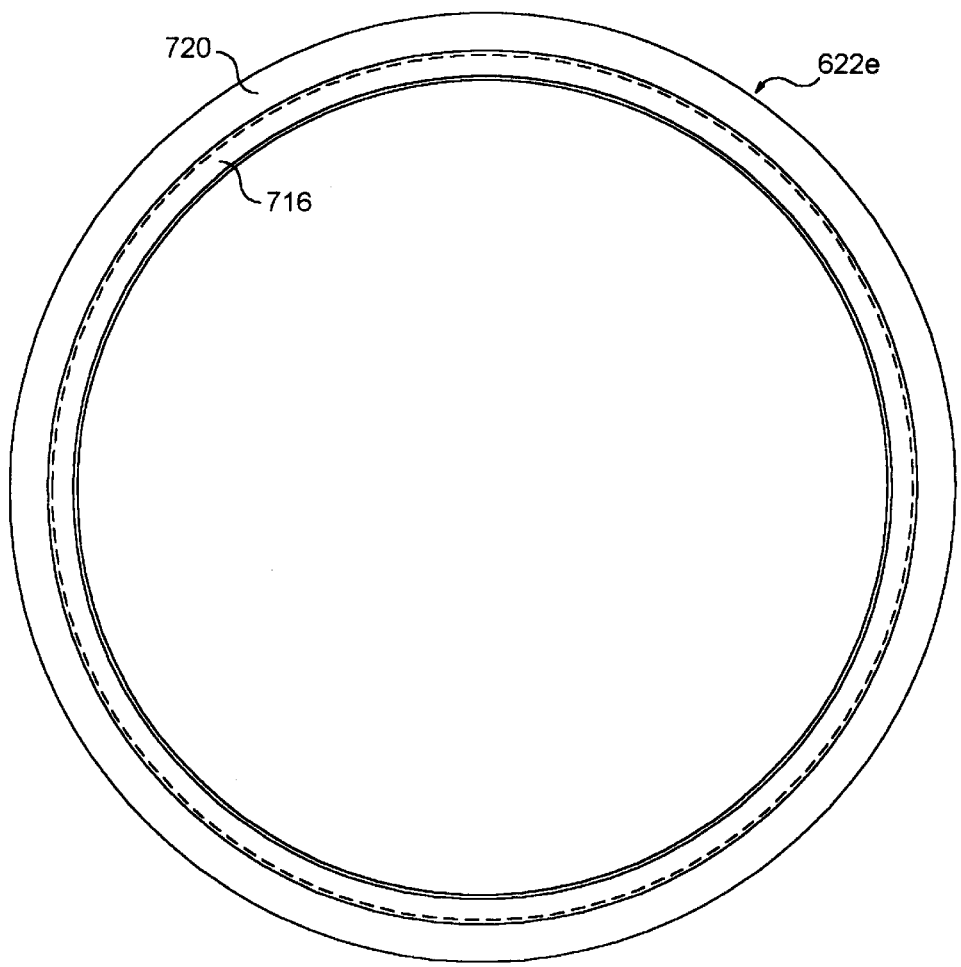
FIG. 7F is a bottom plan view of an outer piece for a radiation shield according to the first embodiment.

The outer piece 622e of the radiation shield supports the outer edge of wafer 502. FIG. 7E is a side cross-sectional view, and FIG. 7F is a bottom plan view, of outer piece 622e. As shown in FIGS. 7E and 7F, outer piece 622e has a recessed shelf region 716 for receiving and supporting the edge of wafer 502. Only a small portion (approximately a few millimeters) of the wafer edge rests on this shelf region 716. In the first embodiment, this is the only portion of the radiation shield that makes contact with wafer 502 during processing. Extending downward from shelf region 716 is a cylindrical support portion 718 which rests on the annular ring piece 622d of the radiation shield as shown in FIG. 6A. As shown in FIGS. 7E and 7F, an annular ring portion 720 of the outer piece 622e is elevated relative to the step portion by approximately sixty thousandths (0.060) of an inch. The annular ring portion 720 extends radially outward from the wafer edge effectively providing a thermal extension to wafer 502. This annular ring portion 720 provides extra thermal insulation to retain heat at the outer edge of wafer 502 where heat losses are the greatest due to the proximity of the chamber walls. Referring to FIGS. 6A and 6B, a resistive silicon carbide coated graphite peripheral heater 528 may be placed below outer piece 622e to provide additional heat to compensate for heat losses at the edge of wafer 502. The intensity of radiant energy heating sources positioned above the periphery of the wafer may also be increased to compensate for edge losses. However, a resistive heater provides advantages over many radiant energy heating sources that use linear filaments, since the resistive heater provides a uniform circumferential band of heat at a peripheral region of the wafer edge where heat losses are the greatest. In contrast many radiant energy heating sources use linear filaments which provide heat in linear segments and as a result are ineffective or inefficient at providing a uniform circumferential band of heat.

FIG. 8 is a side cross sectional view of an alternative embodiment of a rapid thermal processing chamber according to the present invention. FIG. 8 illustrates the same design as FIG. 6A except that a plurality of optical sensors 826, 850 and 860 are deployed at various radii across the wafer surface. The components in FIG. 8 that correspond to components in FIG. 6A are referenced using the same number except that an eight is used in the hundreds decimal place for clarity. Additional optical sensors 850 and 860 are preferably optical fibers in the alternative embodiment. The optical fibers are relatively stiff and support themselves within the cavity. The end of each optical fiber is beveled to direct light from the wafer surface into the corresponding optical sensor from which the temperature of the wafer at a given radius may be determined.

Only a single optical sensor is used to measure the temperature of the wafer at each radius since the wafer rotates and the optical sensor thereby collects light that is an average of the light emitted by the wafer along the corresponding radius. The intensity sampled at each radius (or the temperature calculated therefrom) may then be compared to detect temperature differences across the wafer surface. In particular, the intensity of light sampled by optical sensor 850 at the wafer edge may be compared to the intensity of light sampled by optical sensor 826 at the center of the wafer. The heat provided by ring heater 828 may then be adjusted to compensate for any difference in temperature between the center and edge of wafer 802. In addition (or alternatively), the intensity of lamps or other radiant energy heating sources positioned above the periphery of the wafer may be controlled to adjust for temperature differences. See, e.g., U.S. Pat. No. 5,268,989 to Moslehi et al. ("Moslehi") which is incorporated herein by reference. A lamp system similar to that described in Moslehi may be used to compensate for temperature differences detected by optical sensors deployed in a shielded region according to the present invention. Two or more optical sensors may be positioned in the shielded region to sample the intensity of light at various positions along the wafer surface. The number of optical sensors may vary depending upon the number of individually controlled lamp modules or other heaters that are used.

FIG. 9 illustrates an alternative passive method for compensating for edge heat losses. FIG. 9 illustrates the same design as FIG. 6A except that the radiation shield provides more thermal insulation near the periphery of wafer 902 and no active peripheral heater is used. The components in FIG. 9 that correspond to components in FIG. 6A are referenced using the same number except that a nine is used in the hundreds decimal place for clarity. The extra thermal insulation is provided by adding annular rings 950 to the outer piece 922e of the radiation shield as shown in FIG. 9. The amount of extra thermal insulation at the periphery of the wafer may be adjusted by adding annular rings as necessary to compensate for average edge losses in a particular reactor design.

In each of the above embodiments, the radiation shield (522, 822 and 922) and the wafer (502, 802 and 902) substantially prevent light from being transmitted into the cavity (524, 824 and 924) at the wavelengths used for optical pyrometry. The radiation in the cavity is predominantly emitted by the wafer and radiation shield. Therefore, the cavity approximates an ideal black-body cavity radiator and the temperature of the cavity may be determined using the equations listed in Table 1.

TABLE 1

(1) $$L = \frac{K\epsilon^1 C_1}{\lambda^5 \left[ \exp\left(\frac{C_2}{\lambda T}\right) - 1 \right]}$$

(2) $$\epsilon^1 = \frac{\epsilon}{\epsilon(1 - \alpha/S) + \alpha/S}$$

The first equation in Table 1 is Planck's equation which defines the relationship between the flux density of light emitted from an object and the temperature of that object. For the form of Planck's equation listed in Table 1, L is the radiance of light at a given wavelength in w/m; $\lambda$ is the wavelength of light; K is a physical constant relating to the shape, light transmitting properties and dimensions of the optical sensor; T is the temperature of an object in degrees Kelvin; $\epsilon^1$ is the effective (or apparent) emissivity of the object; $C_1$ is the first radiation constant, $0.59544 \times 10^{-16}$ w·m$^2$; and $C_2$ is the second radiation constant, $1.438786 \times 10^{-2}$ mK. The second equation in Table 1 is an equation for determining the effective emissivity, $\epsilon^1$, of a cavity radiator where $\epsilon$ is the intrinsic emissivity at a given temperature of the material comprising the cavity walls; S is the surface area of the cavity; and $\alpha$ is the surface area of an aperture into the cavity (through which the flux density of light is measured). In an ideal cavity radiator $\alpha/S$ approaches zero ($\emptyset$), so the effective emissivity of the cavity is one (1) regardless of the shape of, or materials used for, the cavity walls. In addition, an ideal cavity radiator is assumed to have walls of equal temperature.

In the first embodiment, the temperature of wafer 502 is calculated based upon the flux density of light sampled by optical sensor 526. Optical sensor 526 has a cone of vision with an angle of approximately fifty degrees (50°), so optical sensor 526 detects light over an area of wafer 502 as indicated at 625 in FIG. 6A. Since wafer 502 is rotating, localized surface roughness and temperature irregularities may be averaged out to some degree particularly if the cone of vision for optical sensor 526 is offset slightly from the center of wafer 502. Planck's equation as shown in Table 1 (or an approximation based on Planck's equation) may then be used to calculate the temperature of wafer 502 from the measured flux density of light. Conventional optical pyrometry techniques may be used for this purpose. See, e.g., U.S. Pat. No. 4,845,657 to Dils et al. which is incorporated herein by reference.

During thermal equilibrium when the walls of cavity 524 (including wafer 502) are all at substantially the same temperature, the second equation in Table 1 may be used to calculate the effective emissivity which may then be used by the optical pyrometer to determine temperature. It is desirable to configure the cavity to have an effective emissivity greater than the intrinsic emissivity of the wafer for a given wavelength and processing temperature. For instance, with a silicon wafer having intrinsic emissivity of approximately seven tenths (0.7) at a one (1.0) micrometer wavelength for most processing temperatures, it is desirable to configure the cavity to raise the effective emissivity of the cavity above nine tenths (0.9). As the effective emissivity is further increased toward unity (i.e. from 0.95 to 0.96 to 0.97 to 0.98 and above) further advantages are realized as the temperature measurement becomes less dependent on the intrinsic emissivity of the wafer. To achieve these advantages, it is desirable to decrease the ratio of the aperture area to the surface area of the cavity ($\alpha/s$) to one tenth (0.1) or less. In the first embodiment, the aperture into the cavity 524 for measuring the flux density of light is a cross section of the shaft through which optical sensor 526 is introduced into cavity 524 and the area of that aperture, $\alpha$, is on the order of $0.0039\pi$ square inches. The internal surface area of the cavity as a whole, S, on the other hand is greater than twice the surface area of wafer 502, which for a two hundred millimeter (200 mm) wafer is approximately $32\pi$ square inches. Therefore, the ratio of the aperture area to the cavity surface area, $\alpha/S$, is on the order of 0.0039/32 (approximately 0.00012) and the effective emissivity calculated from the second equation in Table 1 is close to unity and is substantially independent of the intrinsic emissivity, $\epsilon$, of the cavity walls. Therefore, the calculation of wafer temperature (near thermal equilibrium) in the first embodiment is substantially insensitive to the intrinsic emissivity of wafer 502. Importantly, this allows a wide range of wafer types, materials, dopant levels and layers to be processed without substantially affecting the accuracy of the temperature measurement.

However, the cavity 524 will deviate from ideal cavity radiator conditions particularly during temperature ramp up and ramp down. During temperature ramp up, the wafer 502 (which is exposed directly to lamp radiation) will heat up more quickly than radiation shield 522 (most of which is not directly exposed to lamp radiation). For instance, initially the flux density of light detected at the surface of wafer 502 will correspond to the intrinsic emissivity of wafer 502 (rather than a higher effective emissivity of the cavity), since radiation shield 522 may not yet be contributing to the emitted light at a level corresponding to the temperature of the wafer. However, even outside of thermal equilibrium conditions, the first embodiment is relatively free from the effects of complex and dynamic changes in the emissivity of wafer 502. This is accomplished in the first embodiment by choosing a wavelength for optical pyrometry at which the emissivity of wafer 502 is relatively stable over a range of temperatures. A wavelength in the range of eight tenths (0.8) to one and two tenths (1.2) micrometers is used in the first embodiment, with a wavelength of one (1.0) micrometer being particularly advantageous, since the emissivity of a pure silicon wafer (and certain doped and layered silicon wafers) is relatively stable at these wavelengths. In addition, the transmission of pure silicon (and most other silicon and non-silicon based semiconductor materials) at these wavelengths is relatively low. In addition, dynamic changes in the emissivity of wafer 502 due to deposition of layers on the backside of wafer 502 is eliminated in the first embodiment, since radiation shield 522 prevents deposits from forming on the backside of wafer 502.

Thus, it is believed that even outside of thermal equilibrium the temperature of wafer 502 may be accurately determined without complex dynamic dependencies upon the intrinsic emissivity of wafer 502. To the extent that the temperature of the radiation shield 522 lags the temperature of wafer 502, and therefore does not emit sufficient light to raise the effective emissivity close to unity, it is believed that a linear (or near linear) adjustment may be made to the temperature calculation based upon the emissivity and other thermal properties of the silicon carbide radiation shield (which may be determined in advance). In addition, calibration light source 540 may be used to determine the intrinsic emissivity of the wafer before processing which may also be used to adjust the temperature calculation. In the first embodiment, the lag in heating of the radiation shield 522 relative to wafer 502 due to indirect exposure to lamps 516 is mitigated by heat provided by peripheral heater 528 below the radiation shield. In addition (or in alternative), other embodiments may use radiant energy heating sources or other heaters positioned below the shield to compensate for uneven heating. As described above, the peripheral heater also helps compensate for heat losses at the wafer edges. The need for adjustments to the temperature calculation will depend upon a variety of factors related to the particular reactor design including relative exposure of the wafer and radiation shield to heaters, as well as the shape, thickness and material(s) used for the radiation shield. However, it is anticipated that any required adjustment may be determined experimentally in advance rather than requiring complex dynamic adjustments based on direct measurements of emissivity and other conditions as are required in some conventional systems. A thermocouple or similar device may be used to calibrate the optical pyrometer and determine any necessary adjustment prior to processing.

Although some adjustment may be necessary for temperature measurement during periods of non-equilibrium, accurate temperature measurement may be achieved in the first embodiment during processing steps where a steady and uniform temperature is desired. During these critical processing steps important advantages are realized, since substantial thermal equilibrium is achieved and temperature measurement becomes substantially insensitive to emissivity. Moreover, during periods of ramp up and ramp down multi-point pyrometry (as described above with reference to FIG. 8) may be used to identify and compensate for undesired temperature nonuniformities even if absolute temperature is not calculated. Rather than calculating absolute temperature, the difference in the flux density of light detected by the three (or more) optical sensors 826, 850 and 860 may be used to detect temperature differences. Peripheral heater 828, lamp modules, or other heaters may then be adjusted as necessary to provide more uniform heating.

In addition to simplifying the measurement of wafer temperature, radiation shield 522 also prevents the undesired deposition of materials on the backside of wafer 502 during processing. Reactive gases (or other substances) introduced into processing chamber 504 through inlet 508 are substantially prevented from entering cavity 524. It should be noted that RTP chemical vapor deposition may occur at a variety of pressures including vacuum conditions at less than twenty (20) Torr (and often less than one (1) Torr). In addition, any gas in cavity 524 may expand when heated. Thus, a channel between processing chamber 504 and cavity 524 (such as channel 617 formed between center piece 622*a* and channel piece 622*b*) is desired to allow pressure equalization during processing. However, channel 617 should be sufficiently narrow to prevent deposition from occurring within cavity 524 and should be shaped to substantially prevent reflected light from entering cavity 524. In the first embodiment, channel 617 includes a plurality of turns and has a width of approximately sixty thousandths (0.060) of an inch. This narrow channel inhibits the incidental reflection of light into the cavity and depletes reactive gases well before they reach the cavity.

A purge gas, such as hydrogen, may also be introduced into cavity 524 through sheath 615 surrounding optical sensor 526. The purge gas exits the cavity through channel 617 and may help prevent deposits within the channel. However, due to the narrow width of channel 617 in the first embodiment, it is believed that purge gases are unnecessary for this purpose. In fact, the use of purge gas is limited in the first embodiment to avoid potential cooling effects within cavity 524. Only a small amount (on the order of 100 SCC/min.) is used to avoid deposits on optical sensor 526 from silicon or other material vaporized from wafer 502 during processing at low pressures and high temperatures (generally greater than 800° C.). Typically, purge gas is not used in the first embodiment to prevent deposition from reactive gases in processing chamber 504. Rather, radiation shield 522 and channel 617 prevent such deposits. In fact, it is believed that purge gases are not necessary for some processes (generally at high pressures and temperatures less than 800° C.).

Figure 10:
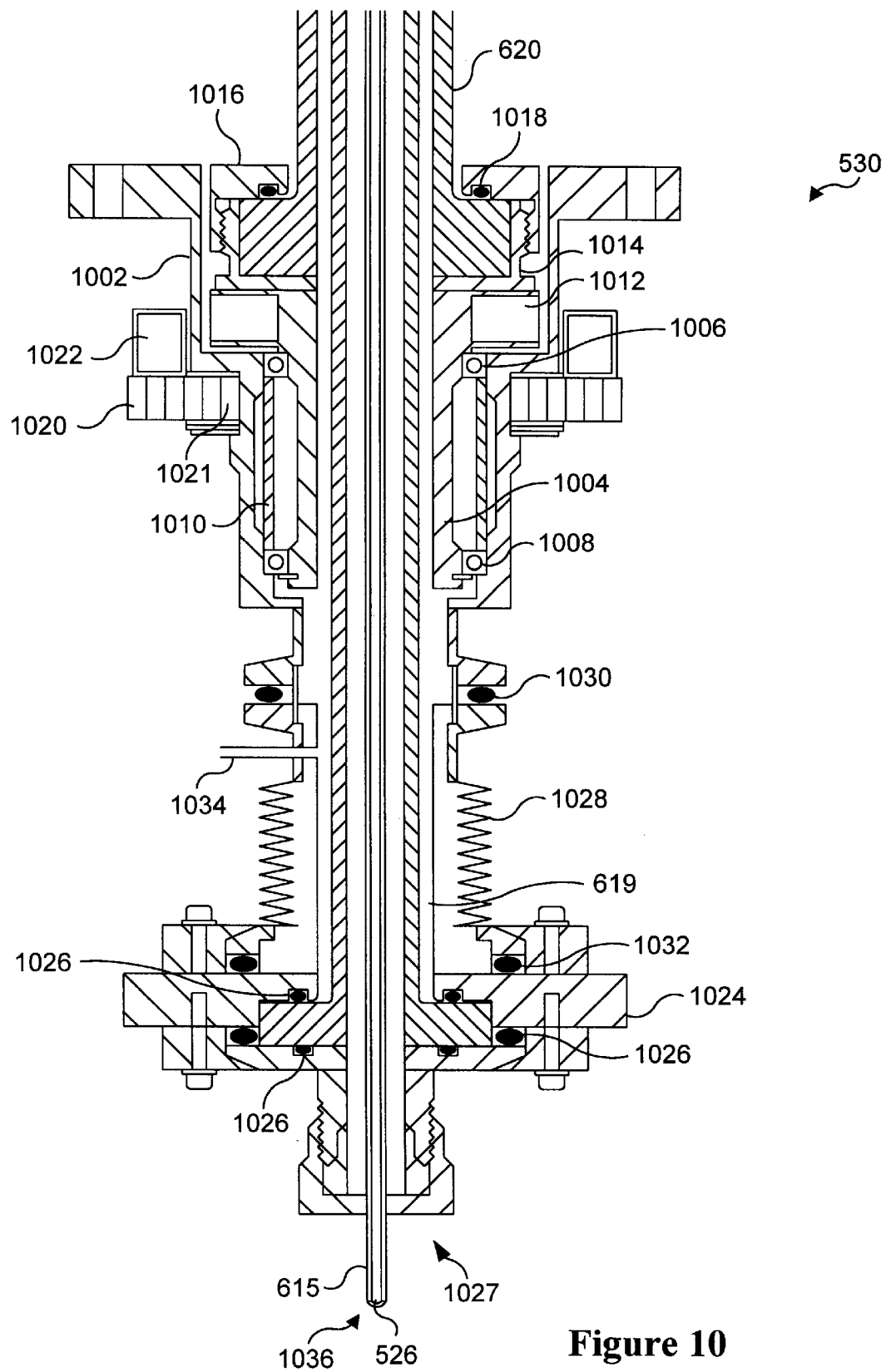
FIG. 10 is a side cross sectional view of a central support and drive mechanism according to the first embodiment of the present invention.

When purge gases are used, they may be introduced through a central support and drive mechanism which also provides the rotational drive for rotating support 620 and the lift mechanism for center piece 622*a*. This central support and drive mechanism will now be described with reference to FIG. 10. FIG. 10 is a side cross sectional view of a central support and drive mechanism, generally indicated at 530, according to the first embodiment of the present invention. The mechanism 530 is positioned below processing chamber 504. A stainless steel cylindrical housing cup 1002 is bolted to the underside of processing chamber 504. A hole 514 (not shown in FIG. 10) is formed in the bottom wall of the processing chamber over the housing cup 1002. The rotating support 620, center support 619, sheath 615, and optical sensor 526 pass through this hole and into processing chamber 504 as shown in FIG. 5. A seal (not shown) is placed between housing cup 1002 and the bottom wall of processing chamber 504 to provide a vacuum seal.

A stainless steel rotating pedestal 1004 sits within the housing cup 1002. The rotating pedestal 1004 is held in place by two cylindrical bearings 1006 and 1008 which allow the rotating pedestal 1004 to rotate relative to the housing cup 1002. A stainless steel cylindrical spacer 1010 is used to facilitate the placement of bearings 1006 and 1008. An upper portion of the rotating pedestal 1004 sits above bearings 1006. This upper portion of the rotating pedestal 1004 holds a plurality of magnets 1012 which are disposed in a ring radially about the upper portion of the rotating pedestal 1004. Attached to the top surface of the rotating pedestal 1004 is a threaded cylindrical base support 1014 which receives the base of the quartz rotating support 620. A thin resilient pad (not shown) placed inside base support 1014 acts as a cushion between the quartz rotating support 620 and the stainless steel base support 1014. The base of the rotating support 620 is held in place by a threaded stainless steel cover 1016 which screws onto cylindrical base support 1014. A rubber o-ring 1018 or other resilient cushion is placed between cover 1016 and the base of the rotating support 620 to hold the base of the rotating support in place without having to clamp the stainless steel cover directly against the quartz rotating support 620. The rubber o-ring also provides flexibility to allow for expansion and contraction of components.

Around the outside of the housing cup 1002 is placed a cylindrical gear 1020. A cylindrical bearing 1021 is placed between the gear 1020 and the housing cup 1002 to reduce friction. Outer magnets 1022 are mounted on top of the gear 1020 about a radius that is outside of, but slightly below, the ring of inner magnets 1012. The outer magnets 1022 and inner magnets 1012 are magnetically coupled through housing cup 1002. A belt (not shown) drives gear 1020 causing gear 1020 and outer magnets 1022 to rotate about the housing cup 1002. During processing the belt is driven at a rate that will cause rotation at approximately twenty (20) rotations per minute. This, in turn, causes the inner assembly (which includes magnets 1012, rotating pedestal 1004, base support 1014, cover 1016, o-ring 1018, and rotating support 620) to rotate due to the magnetic coupling between inner magnets 1012 and outer magnets 1022. In addition, the magnetic coupling imposes a slight downward force on the inner assembly, since the outer magnets are slightly lower than the inner magnets. This helps hold the inner assembly in place.

The center support 619, sheath 615, and optical sensor 526 pass through a shaft in the center of the inner assembly. The base of the center support 619 is clamped to a stainless steel elevational base support 1024. O-rings 1026 are placed between the center support 619 and the elevational base support 1024 to prevent the stainless steel elevational base support 1024 from clamping directly against the quartz center support 619. The sheath 615 and optical sensor 526 are also coupled to the elevational base support 1024 as indicated at 1027. A bellows 1028 is clamped in place between elevational base support 1024 and housing cup 1002. Rubber o-rings 1030 and 1032 are used to hold bellows 1028 in place while allowing some flexibility for expansion and contraction of components. A pneumatic or electromechanical drive (not shown) is used to raise and lower the elevational base support 1024 in order to raise and lower center support 619, sheath 615, and optical sensor 526. When elevational base support 1024 is raised, bellows 1028 contracts and when elevational base support 1024 is lowered, bellows 1028 expands. This elevational mechanism is used to raise and lower center piece 622a of the radiation shield in order to load and unload wafer 502 from the processing chamber and to prevent bellows 1028 from contracting under vacuum pressure.

A purge gas, such as hydrogen, may be introduced through inlet 1034 to prevent reactive gases from causing deposits within mechanism 530. A purge gas may also be introduced at 1036 through the sheath 615 to prevent deposits on optical sensor 526.

A typical RTP process will now be described with reference to FIGS. 8 and 10. During rapid thermal processing, the elevational base support 1024 (and in turn center piece 822a) starts out in a raised position. Initially, gear 1020 (and pieces 822b, 822c, 822d, and 822e of the radiation shield) is not rotating. A wafer 802 is placed on raised center piece 822a through a conventional load lock mechanism. The elevational base support 1024 is then lowered, which lowers the center piece 822a and places the wafer edges on outer piece 822e of the radiation shield. Gear 1020 is then rotated at approximately twenty (20) rotations per minute which in turn causes outer piece 822e and wafer 802 to rotate at the same rate. For one common RTP process, the lamps 816 and peripheral heater 828 are then ramped up to about eight hundred degrees Celsius (800° C.) over a period of about ten (10) seconds. During this ramp up period, the power to the peripheral heater 828 (or the lamps) may be adjusted to compensate for any, difference in intensity detected by optical sensors 826, 850 and 860. The lamps and peripheral heater are then held at a level of approximately eight hundred degrees Celsius (800° C.) for about one (1) minute to allow the temperature of the system to stabilize before further increases in temperature. Optical sensors 826, 850 and 860 are used to monitor the temperature of wafer 802 during this period of time. Minor adjustments may be made to lamps 816 and peripheral heater 828 to maintain the wafer at this temperature and to adjust for any temperature non-uniformities. The temperature of wafer 802 is then gradually ramped up to a desired temperature for processing over a period of about one (1) minute. Typically, the wafer is heated to a temperature in the range of from about eight hundred degrees Celsius (800° C.) to about one thousand two hundred degrees Celsius (1200° C.), with a temperature of one thousand one hundred degrees Celsius (1100° C.) being common. Optical sensors 826, 850 and 860 are used to monitor the temperature of wafer 802 and adjust for any nonuniformities during this period of time. A processing step, such as deposition, anneal or the like, may then be performed. A substance for chemical or physical vapor deposition, etching, or other processing may be introduced into the chamber through inlet 808 or other conventional mechanisms. Typically the temperature is held constant during processing. This processing step typically lasts anywhere from ten seconds to several minutes. The temperature is then ramped down over a period of about thirty (30) seconds. Once again, optical sensors 826, 850 and 860 are used to monitor the temperature of wafer 802 and adjust for any nonuniformities. Normally as a wafer cools in a cold wall RTP chamber, there will be large heat losses at the wafer edges due to the proximity of the walls. In order to compensate for this effect, the temperature of peripheral heater 828 is carefully controlled based on the measurements of optical sensors 826, 850 and 860. Even after the power to the lamps 816 and ring heater 828 has been shut off, the wafer may be left in place for a short period of time. During this period of time, the thermal insulation provided by the peripheral heater 828 continues to compensate for edge heat losses which allows for more uniform cooling. At this point, the rotation of gear 1020 and wafer 802 may be discontinued. The elevational base support 1024 is then raised, which raises the center piece 822a and wafer 802. The wafer is then removed through a conventional load lock mechanism. The wafer may continue to cool at a different location while another wafer is loaded into chamber 804 for processing. It will be readily understood that the above description of a typical RTP process is exemplary only, and that any variety of time periods, temperatures, and steps may be used for processing.

The foregoing description is presented to enable any person skilled in the art to make and use the invention. Descriptions of specific designs are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

For instance, it will be readily apparent to those of ordinary skill in the art that aspects of the present invention may be applied in any variety of semiconductor substrate processing systems using a wide range of heaters, reactive gases, pressures and temperatures. For example, while particular advantages are realized when using aspects of the invention in a radiant energy heating source RTP system, aspects of the invention may be applied to systems using other heaters, including without limitation contact or proximity resistive heaters or reflection or diffusion radiant energy heating systems.

Moreover, under certain circumstances a shielded region providing an effective black-body cavity may be provided adjacent to only a portion of a semiconductor substrate rather than across the entire substrate surface. A shielded region may also be provided by a shield that does not contact or entirely enclose a substrate surface. For instance, a shield may be closely spaced to the substrate with gaps or channels formed between the shielded region and the processing chamber. Although the gaps or channels may not contain turns as in the first embodiment, most light from the processing chamber may be required to follow a path with multiple reflections before reaching an optical sensor in the shielded region. Thus, even with openings to the processing chamber, a shield may be used to substantially prevent extrinsic light from interfering with an optical sensor.

In addition, the interior surface of the radiation shield could be provided with a reflective finish or coated with a reflective material in order to create a reflective cavity with an effective emissivity approaching unity. It is believed that such a reflective cavity will provide results superior to conventional reflective cavities due to the small aperture size, isolation of the cavity from chamber walls, and isolation of the cavity from external sources of light. However, a reflective cavity approach is expected to be more expensive than the approach of the first embodiment while potentially exposing the wafer to localized reflective hot spots and contaminants from mirrored surfaces. In addition, the reflective surfaces may require regular cleaning to maintain a high level of reflectivity. Other coatings may also be used on the radiation shield to improve thermal properties. For instance, in certain embodiments it may be useful to coat the interior surface of the radiation shield with a material (such as silicon or gallium arsenide) that has properties similar to the semiconductor substrate. For certain radiation shields this may reduce the risk of contaminating the substrate and may cause the shielded region to behave more like an ideal cavity radiator.

Another modification would be to eliminate the channel which allows rotation and pressure equalization. The wafer could be stationary or the entire support mechanism could rotate. In addition, pressure equalization could be accomplished by gas provided and removed through a center support rather than through a separate channel. In addition, the radiation shield may comprise a variety of materials that are substantially nontransmissive to light at a desired wavelength, and the radiation shield may be assembled from any variety of pieces or may be produced from a single piece of material. Further, for some processes, the reactor chamber walls may form part of the shield for the shielded region. A heat source, such as a resistively heated conductive block, may also form part of the shield. For instance, a semiconductor substrate may be placed upon a heated block which has a small recessed region forming a cavity below a small portion of the substrate. An optical sensor could be inserted into the cavity through a hole in the heated block.

In addition, enclosing the backside of a substrate according to aspects of the present invention may be used to prevent backside deposition even if cavity radiation is not being used to calculate temperature. In such cases, the cavity shield may be constructed using materials having a wider range of light transmissive and thermal properties. For instance, a clear quartz shield could be used in conjunction with lamps on either side of a wafer to allow heating from both sides of the wafer while preventing deposition on one side.

While this invention has been described and illustrated with reference to particular embodiments, it will be readily apparent to those skilled in the art that the scope of the present invention is not limited to the disclosed embodiments but, on the contrary, is intended to cover numerous other modifications and equivalent arrangements which are included within the spirit and scope of the following claims.

We claim:

1. A thermal processing system for processing a semiconductor substrate at a processing temperature comprising:
    a processing chamber within which the substrate is placed for processing;
    at least one heater for providing heat to the processing chamber;
    a shield comprising a material substantially nontransmissive to light within a given range of wavelengths at the processing temperature;
    the shield forming a cavity adjacent to the substrate wherein extrinsic light within the given range of wavelengths is prevented from reflecting into the cavity;
    the shield absorbing heat and emitting substantial thermal radiation within the cavity;
    wherein the shield provides thermal insulation for maintaining substantial temperature uniformity of the substrate during processing; and
    a first optical sensor disposed for sampling the intensity of light in the cavity within the given range of wavelengths and for producing an output representative of said intensity.

2. The system of claim 1, wherein the shield forms an aperture and the first optical sensor samples the intensity of the light in the cavity through the aperture.

3. The system of claim 2, wherein the optical sensor passes through the aperture such that the optical sensor is directly exposed to light emitted from the substrate within the cavity.

4. The system of claim 3, further comprising a processing chamber containing a substance for forming deposits on the substrate;

wherein the shield substantially prevents the substance from forming deposits on the optical sensor.

5. The system of claim 2, wherein the aperture and the cavity each have a surface area, and the surface area of the aperture is less than one tenth (0.1) of the surface area of the cavity.

6. The system of claim 2, wherein:

the shield comprises at least two pieces, including a rotating piece and a non-rotating piece;

the rotating piece supports the substrate and rotates the substrate during processing; and the non-rotating piece forms the aperture for the first optical sensor.

7. The system of claim 1 further comprising a processing chamber containing a substance for forming a deposit on the substrate;

wherein a first surface of the substrate is exposed to the processing chamber and a second surface of the substrate is exposed to the cavity;

and the shield substantially prevents the substance from forming a deposit on the second surface of the substrate.

8. The system of claim 1, wherein the substrate is substantially nontransmissive to light within the given range of wavelengths at the processing temperature.

9. The system of claim 1, wherein the given range of wavelengths is less than three and one half (3.5) micrometers.

10. The system of claim 1, wherein the given range of wavelengths is within the range of about eight tenths (0.8) to one and two tenths (1.2) micrometers.

11. The system of claim 1, wherein the optical sensor comprises an optically-transmissive fiber.

12. The system of claim 1, wherein the optical sensor comprises an optically-transmissive light pipe.

13. The system of claim 1, wherein the cavity has an effective emissivity at the processing temperature, the substrate has an intrinsic emissivity at the processing temperature, and the effective emissivity of the cavity is substantially greater than the intrinsic emissivity of the substrate at the processing temperature.

14. The system of claim 1, wherein the shield comprises silicon carbide.

15. The system of claim 1, wherein the shield comprises graphite.

16. The system of claim 1, wherein the shield comprises silicon carbide coated graphite.

17. The system of claim 1, wherein the shield comprises polycrystalline silicon.

18. The system of claim 1, wherein the thermal insulation provided by the shield varies across the substrate such that the uniformity of the substrate's temperature is enhanced during processing.

19. The system of claim 1, wherein the shield provides a greater amount of thermal insulation at a peripheral region of the substrate than in a central region of the substrate.

20. The system of claim 1, wherein the shield has a thickness selected such that the shield and the substrate heat at substantially the same rate.

21. The system of claim 1, wherein the shield and the substrate each have a thickness, and the thickness of the shield is within a factor of three (3) of the thickness of the substrate.

22. The system of claim 1, wherein the surface of the shield is coated with silicon.

23. The system of claim 1, wherein the heater comprises a radiant energy heating source which radiates light to heat the substrate, wherein the light radiated by the radiant energy heating source includes light with substantial intensity within the given range of wavelengths.

24. The system of claim 1, further comprising a second heater providing heat predominantly at a peripheral region of the substrate.

25. The system of claim 24, wherein the second heater is a resistive heater positioned adjacent to a peripheral region of the substrate.

26. The system of claim 1, further comprising an optical pyrometer responsive to the output of the optical sensor for determining the temperature of the substrate as a function of the optical sensor output and for producing a control signal representative of said temperature.

27. The system of claim 26, further comprising a heater control for controlling the heater;

the heater control adjusting the heat provided by the heater to compensate for the detected temperature difference in response to the control signal from the optical pyrometer.

28. The system of claim 27, further comprising a resistive second heater responsive to the heater control positioned adjacent to a peripheral region of the substrate.

29. A The system of claim 1, wherein the shield comprises at least two pieces separated by at least one channel.

30. The system of claim 1, wherein the processing temperature is greater than about six hundred degrees Celsius (600° C.).

31. The system of claim 1, further comprising an inlet for providing a purge gas to the cavity.

32. The system of claim 1 further comprising a sheath for the first optical sensor, wherein the sheath forms a path for providing a purge gas to inhibit deposits on the optical sensor.

33. The system of claim 1, wherein the surface of the shield is more emissive than reflective.

34. The system of claim 1, wherein the surface of the shield reaches a temperature greater than about six hundred degrees Celsius (600° C.) during processing.

35. The system of claim 34, wherein the surface of the shield is more emissive than reflective.

36. The system of claim 1, further comprising a resistive peripheral heater with a high thermal mass heating element adjacent to the substrate.

37. The system of claim 36 wherein the peripheral heater is a ring heater.

38. The system of claim 1, further comprising a supplementary resistive heater adjacent to the shield, wherein the supplementary resistive heater heats the shield to enhance the thermal insulation provided for the substrate.

39. A thermal processing system for processing a semiconductor substrate within a range of processing temperatures, the processing system including an improved temperature control system for determining thermal characteristics of the substrate based upon light intensity within a given range of wavelengths, the temperature control system comprising:

a shield comprising a material substantially nontransmissive to light within the given range of wavelengths at the processing temperatures;

the shield having a surface positioned relative to the substrate such that a cavity is formed between the substrate and the surface of the shield;

the shield and the substrate substantially preventing extrinsic light within the given range of wavelengths from reflecting into the cavity;

a first optical sensor disposed for sampling the intensity of light in the cavity within the given range of wavelengths and for producing an output representative of said intensity;

wherein the shield forms an aperture and the first optical sensor samples the intensity of the light in the cavity through the aperture;

the shield comprises at least two pieces, including a rotating piece and a non-rotating piece;

the rotating piece supports the substrate and rotates the substrate during processing; and the non-rotating piece forms the aperture for the first optical sensor;

further comprising an elevational actuator coupled to the non-rotating piece such that raising and lowering the elevational actuator causes the non-rotating piece to be raised and lowered.

40. A thermal processing system for processing a semiconductor substrate comprising:

a processing chamber wherein light is radiated into the processing chamber;

a first surface of the substrate exposed to the processing chamber for processing;

a shield having an interior surface positioned relative to a second surface of the substrate such that a shielded region is formed between the second surface of the substrate and the interior surface of the shield;

the shield absorbing heat and emitting substantial thermal radiation within the shielded region;

wherein the shield provides thermal insulation for maintaining substantial temperature uniformity of the substrate during processing; and an optical sensor disposed to sample the intensity of light emitted in the shielded region within a given range of wavelengths;

wherein the shield and the substrate substantially prevent the light in the processing chamber from interfering with the intensity of the emitted light sampled by the optical sensor.

41. The system of claim 40, wherein the given range of wavelengths is greater than one and one half (1.5) micrometers.

42. The system of claim 40, further comprising a heater which radiates light into the processing chamber to heat the substrate wherein the light radiated by the heater includes light with substantial intensity within the given range of wavelengths.

43. The system of claim 42, wherein the given range of wavelengths is less than three and one half (3.5) micrometers.

44. The system of claim 42, wherein the given range of wavelengths is within the range of about eight tenths (0.8) to one and two tenths (1.2) micrometers.

45. The system of claim 44, wherein the heater is selected from the group consisting of tungsten filament lamps and arc lamps.

46. The system of claim 42, wherein the shield and the substrate are each substantially nontransmissive to light within the given range of wavelengths at a desired processing temperature, and the shield and the substrate substantially prevent light within the given range of wavelengths from reflecting into the shielded region from the processing chamber.

47. The system of claim 46, further comprising an optical pyrometer wherein:

the shield forms an aperture and the optical sensor passes through the aperture such that the optical sensor is directly exposed to light emitted from the second surface of the substrate within the given range of wavelengths; and the optical sensor forms an optically-transmissive path from the shielded region to the optical pyrometer.

48. The system of claim 40 further comprising:

a chamber wall forming an inlet for providing a substance into the processing chamber;

wherein the substance comprises a material that forms a deposit on the first surface of the substrate at a processing temperature, and the shield substantially prevents the substance from forming a deposit on the second surface of the substrate.

49. The system of claim 48, wherein the shield substantially encloses a backside surface of the substrate.

50. The reactor of claim 48, wherein the shield forms at least one channel between the processing chamber and the shielded region and the channel is sufficiently narrow such that the substance is substantially prevented from entering the shielded region.

51. The system of claim 40, wherein the shield forms at least one channel between the processing chamber and the shielded region.

52. The system of claim 51, wherein the channel has a plurality of turns such that light within the given range of wavelengths is substantially prevented from reflecting into the shielded region from the processing chamber.

53. The system of claim 40, wherein the shielded region has an effective emissivity at a desired processing temperature, the substrate has an intrinsic emissivity at the desired processing temperature, and the effective emissivity of the shielded region is substantially greater than the intrinsic emissivity of the substrate at the desired processing temperature.

54. The system of claim 40, wherein the shield is substantially nontransmissive to light within the given range of wavelengths at a desired processing temperature.

55. The system of claim 40, wherein the interior surface of the shield reaches a temperature greater than about six hundred degrees Celsius (600° C.) during processing.

56. The system of claim 40, wherein the interior surface of the shield is more emissive than reflective.

57. A thermal processing system for processing a semiconductor substrate at a processing temperature comprising:

a processing chamber;

a thermally conducive support for the semiconductor substrate in the processing chamber, the support providing thermal insulation for the substrate;

a lamp system for providing radiant energy to the substrate in the processing chamber; and a resistive peripheral heater adjacent to the support;

wherein the peripheral heater heats the support to enhance the thermal insulation provided by the support at the periphery of the substrate for maintaining substantial temperature uniformity of the substrate during processing.

58. The system of claim 57, wherein the support forms a heated cavity adjacent to the substrate.

59. The system of claim 58, wherein the substrate forms one of the walls of the cavity.

60. The system of claim 58, wherein the support forms a wall of the cavity substantially parallel to the substrate.

61. The system of claim 58 further comprising an optical sensor for sampling the intensity of radiant energy in the cavity.

62. The system of claim 58, wherein the support has a thickness within a factor of three (3) of the thickness of the substrate.

63. The system of claim 58, wherein the processing temperature is greater than about six hundred degrees Celsius (600° C.).

64. The system of claim 57, wherein the heating element of the peripheral heater has a substantially higher thermal mass then the heating element of the lamp system.

65. The system of claim 57, wherein the support has a thickness selected such that the support and the substrate heat at substantially the same rate.

66. The system of claim 57, wherein the support has a thickness within a factor of three (3) of the thickness of the substrate.

67. The system of claim 57, wherein the support rotates the substrate relative to the peripheral heater during processing.

68. The system of claim 57, wherein the processing temperature is greater than about six hundred degrees Celsius (600° C.).

69. The system of claim 57 wherein the peripheral heater comprises silicon carbide coated graphite.

70. The system of claim 57 wherein the support comprises silicon carbide.

71. A thermal processing system for processing a semiconductor substrate at a processing temperature comprising:

a processing chamber within which the substrate is placed for processing;

a lamp system for providing radiant energy to the processing chamber;

a radiation shield forming a cavity adjacent to the substrate, the shield absorbing heat and emitting substantial thermal radiation within the cavity; and a supplemental resistive heater to heat the shield;

wherein the supplemental resistive heater and the shield provide thermal insulation for maintaining substantial temperature uniformity of the substrate during processing.

72. The system of claim 71, wherein the substrate forms one of the walls of the cavity.

73. The system of claim 71, wherein the supplemental heater provides heat preferentially to the peripheral region of the substrate.

74. The system of claim 71 further comprising an optical sensor for sampling the intensity of radiant energy in the cavity.

75. The system of claim 71, wherein the shield has a thickness selected such that the shield and the substrate heat at substantially the same rate.

76. The system of claim 71, wherein the shield has a thickness within a factor of three (3) of the thickness of the substrate.

77. The system of claim 71, wherein the substrate is rotated relative to the supplemental heater during processing.

78. The system of claim 71, wherein the processing temperature is greater than about six hundred degrees Celsius (600° C.).

79. The system of claim 71 wherein the supplemental heater comprises silicon carbide coated graphite.

80. The system of claim 71 wherein the shield comprises silicon carbide.

* * * * *